(12) United States Patent
Roth

(10) Patent No.: US 11,041,902 B2
(45) Date of Patent: Jun. 22, 2021

(54) METHOD AND DEVICE FOR CALIBRATING AN AUTOMATED TEST EQUIPMENT

(71) Applicant: Advantest Corporation, Tokyo (JP)

(72) Inventor: Bernhard Roth, Böblingen (DE)

(73) Assignee: Advantest Corporation, Tokyo (JP)

( * ) Notice: Subject to any disclaimer, the term of this patent is extended or adjusted under 35 U.S.C. 154(b) by 361 days.

(21) Appl. No.: 16/108,034

(22) Filed: Aug. 21, 2018

(65) Prior Publication Data

US 2018/0372794 A1 Dec. 27, 2018

Related U.S. Application Data

(63) Continuation of application No. PCT/EP2016/053796, filed on Feb. 23, 2016.

(51) Int. Cl.
| | |
|---|---|
| *G01R 31/28* | (2006.01) |
| *G01R 31/3193* | (2006.01) |
| *G01R 35/00* | (2006.01) |
| *G01R 31/319* | (2006.01) |
| *G01R 31/317* | (2006.01) |
| *G01R 31/3177* | (2006.01) |

(52) U.S. Cl.
CPC ..... *G01R 31/2834* (2013.01); *G01R 31/3172* (2013.01); *G01R 31/3177* (2013.01); *G01R 31/3191* (2013.01); *G01R 31/31725* (2013.01); *G01R 31/31937* (2013.01); *G01R 35/005* (2013.01)

(58) Field of Classification Search
None
See application file for complete search history.

(56) References Cited

U.S. PATENT DOCUMENTS

| | | | | |
|---|---|---|---|---|
| 4,219,770 | A | * | 8/1980 | Weinert ............... G01N 22/00 324/615 |
| 5,384,781 | A | * | 1/1995 | Kawabata ............ B60T 8/48 714/700 |
| 2003/0030453 | A1 | | 2/2003 | Mayder et al. |
| 2003/0208717 | A1 | * | 11/2003 | Klotchkov ......... G01R 31/3191 714/814 |
| 2006/0010358 | A1 | | 1/2006 | Miller |
| 2008/0231297 | A1 | | 9/2008 | Kang |
| 2012/0313618 | A1 | | 12/2012 | Phillips |

* cited by examiner

*Primary Examiner* — Roy Y Yi

(57) ABSTRACT

The invention concerns devices and methods for calibrating an Automated Test Equipment for automated testing of a Device Under Test. The method includes providing two digital channel signals by two different channels of the Automated Test Equipment, wherein the digital channel signals include an identical or a complementary pattern with respect to their edges. The method further includes sum-combining or difference-combining the two digital channel signals in order to obtain a combined residual signal. The step of combining is performed such that combining provides a combined residual signal without a time-variant component if the two digital channel signals have a predetermined time shift or a predetermined phase shift relative to each other, or such that the combined residual signal includes a time variant component if the two digital channel signals have a time shift different from the predetermined time shift or a phase shift different from the predetermined phase shift.

21 Claims, 14 Drawing Sheets

METHOD AND DEVICE FOR CALIBRATING AN AUTOMATED TEST EQUIPMENT

CROSS-REFERENCE TO RELATED APPLICATIONS

This application is a continuation of copending International Application No. PCT/EP2016/053796, filed Feb. 23, 2016, which is incorporated herein by reference in its entirety.

Embodiments of the present invention relate to a method for calibrating an Automated Test Equipment, a timing calibration unit for an Automated Test Equipment, a calibratable Automated Test Equipment, a method for calibrating an Automated Test Equipment for automated testing of a Device Under Test, and a computer program for implementing said method.

BACKGROUND OF THE INVENTION

In Automatic Test Equipment (ATE) there may be big numbers of digital channel resources, ranging up to several thousand. It is important for accurately testing devices that these channels have a very small timing difference with respect to each other. That means, when all channels are programmed to a certain timing, it is expected that their edges show up within a certain allowable tight timing window, when measured with a timing measurement instrument (e.g. oscilloscope), at the point of interface (usually a connector or pogo pin or DUT socket).

In order to calibrate the timing, it has to be measured. Traditionally, two approaches are used for measuring; a relay matrix and a robotic probe.

A relay matrix can connect one channel at a time to a common point where an appropriate timing measurement unit can observe signals. Or it connects two channels where one serves as the timing measurement unit.

A robotic probe with the timing measurement unit physically travels from one customer accessible channel location (e.g. pogo point) to another and measures the signals sequentially.

Both conventional calibration approaches use mechanical components which can wear out and it can take a very long time to complete several thousand channels' calibration.

SUMMARY

According to an embodiment, a method for calibrating an Automated Test Equipment for automated testing of a Device Under Test may have the steps of: providing at least two digital channel signals by at least two different channels of the Automated Test Equipment, wherein the digital channel signals comprise, except for a possible time shift relative to each other, an identical or a complementary pattern with respect to their edges; sum-combining or difference-combining the at least two digital channel signals in order to obtain a combined residual signal; wherein the step of combining is performed such that the combining provides a combined residual signal without a time-variant component if the at least two digital channel signals have a predetermined time shift or a predetermined phase shift relative to each other, or such that the combined residual signal comprises a time variant component if the two digital channel signals have a time shift different from the predetermined time shift or a phase shift different from the predetermined phase shift; and wherein the method further comprises measuring the combined residual signal and determining a relative timing of the at least two digital channel signals relative to each other on the basis of the measurement of the combined residual signal.

According to another embodiment, a timing calibration unit for an Automated Test Equipment may have: a digital channel interface configured to receive at least two digital channel signals provided by at least two different channels of the Automated Test Equipment, wherein the digital channel signals comprise, except for a possible time shift relative to each other, an identical or a complementary pattern with respect to their edges; a combiner configured to sum-combine or difference-combine the at least two digital channel signals in order to obtain a combined residual signal; wherein the combiner is configured to perform the combining such that the combination provides a combined residual signal without a time-variant component if the at least two digital channel signals have a predetermined time shift or a predetermined phase shift relative to each other, and such that the combined residual signal comprises a time variant component if the two digital channel signals have a time shift different from the predetermined time shift or a phase shift different from the predetermined phase shift; and wherein the timing calibration unit is configured to measure the combined residual signal and to determine a relative timing of the at least two digital channel signals relative to each other on the basis of the measurement of the combined residual signal.

According to another embodiment, a calibratable Automated Test Equipment may have: a digital channel signal generator configured to generate and to provide at least two digital channel signals by at least two different channels; wherein the digital channel signals comprise, except for a possible time shift relative to each other, an identical or a complementary pattern with respect to their edges; and an inventive timing calibration unit.

According to another embodiment, a method for calibrating an Automated Test Equipment for automated testing of a Device Under Test may have the steps of: generating at least two digital channel signals, wherein the digital channel signals comprise, except for a possible time shift relative to each other, an identical or a complementary pattern with respect to their edges; receiving a combined residual signal combined from the at least two digital channel signals; analyzing the combined residual signal as to a time-variant component and, if no time-variant component is detected, generating a first information indicating that the at least two digital channel signals have a predetermined time shift or a predetermined phase shift relative to each other, or if a time-variant component is detected, generating a second information indicating that the two digital channel signals have a time shift different from the predetermined time shift or a phase shift different from the predetermined phase shift; and determining a relative timing of the at least two digital channel signals relative to each other based on the analyzed time-variant component.

Another embodiment may have a non-transitory digital storage medium having a computer program stored thereon to perform the method for calibrating an Automated Test Equipment for automated testing of a Device Under Test, the method having the steps of: generating at least two digital channel signals, wherein the digital channel signals comprise, except for a possible time shift relative to each other, an identical or a complementary pattern with respect to their edges; receiving a combined residual signal combined from the at least two digital channel signals; analyzing the combined residual signal as to a time-variant component and, if no time-variant component is detected, generating a first information indicating that the at least two digital channel signals have a predetermined time shift or a predetermined phase shift relative to each other, or if a time-variant component is detected, generating a second information indicating that the two digital channel signals have a time shift different from the predetermined time shift or a phase shift different from the predetermined phase shift; and determining a relative timing of the at least two digital channel signals relative to each other based on the analyzed time-variant component, when said computer program is run by a computer.

According to a first aspect of the invention, a method for calibrating an Automated Test Equipment for automated testing of a Device Under Test is provided. The inventive method provides for a fast execution due to processing of at least two signals in parallel. The method comprises providing at least two digital channel signals by at least two different channels of the Automated Test Equipment, wherein the digital channel signals comprise, except for a possible time shift relative to each other, an identical or a complementary pattern with respect to their edges. In other words, the digital channel signals comprise a certain signal pattern, wherein a digital channel signal is usually represented by a rising edge, a falling edge and a steady state, for instance a constant level (high or low) steady state, therebetween. The method further comprises sum-combining or difference-combining the at least two digital channel signals in order to obtain a combined residual signal. In other words, the two digital channel signals are combined to a common combined residual signal which might itself be a digital channel signal again. The at least two digital channel signals can either be combined by adding them, i.e. by sum-combining them, or by subtracting them, i.e. by difference-combining them. The step of combining, i.e. both sum-combining and difference-combining, may be performed in basically two different ways. First, if the at least two digital channel signals have a predetermined time shift or a predetermined phase shift relative to each other, the combination of these two digital channel signals yields a combined residual signal without a significant time-variant component. Electrical, mechanical and electro-mechanical components may usually comprise inherent or parasitic fluctuations and/or varying tolerances producing measurable noise. However, compared to said noise, a 'significant' time-variant component can be understood as a time-variant component that is clearly identifiable as such when it is measured with a measuring device. A combined residual signal without a significant time-variant component may, in turn, be understood as a non-measurable time-variant component, and it may also imply a possibly existing time-variant that is, however, negligibly small compared to the remaining signal. For example noise may be a non-significant time-variant component. A significant time-variant component can also be understood as a time-variant signal component with a signal strength that lies outside a predetermined threshold value. Conversely, a time-variant signal component having a signal strength that lies within a predetermined threshold value may be regarded as not being significant. However, the aforementioned second way of performing the step of combining is done such that the combined residual signal comprises a significant time variant component if the two digital channel signals have a time shift different from the predetermined time shift or a phase shift different from the predetermined phase shift. In other words, if the at least two digital channel signals, and in particular their leading edges, may appear with a certain relative time shift or phase shift that is larger than the aforementioned predetermined time shift or phase shift, then the combined residual signal comprises a significant time-variant component, i.e. a measurable time-variant component that is detectable as such. Accordingly, when a time-variant component is detected in the combined residual signal, this may indicate a relative timing difference of the at least two digital channel signals relative to each other at the point of detection. The method further comprises measuring the combined residual signal and determining a relative timing of the at least two digital channel signals relative to each other on the basis of the measurement of the combined residual signal. In other words, if the measurement of the combined residual signal reveals that the combined residual signal comprises a time-variant component, this may be an indication that the at least two digital channel signals have a time shift or a phase shift relative to each other at the point of detection. As mentioned before, the determination of a relative timing of the at least two digital channel signals relative to each other is based on the measurement of the combined residual signal. Said determination of said relative timing may be quantitative or qualitative. That is, a quantitative determination may reveal that there is any difference in the relative timing of the at least two digital channel signals relative to each other, while a qualitative determination may reveal the magnitude of the difference in the relative timing of the at least two digital channel signals relative to each other. Accordingly, the timing of the at least two digital channel signals relative to each other can be determined with the inventive method.

According to an embodiment, the measurement of the combined residual signal comprises performing a repeated measurement of the combined residual signal with varying timing-changes of at least one of the at least two different channels, and determining a minimum or a maximum of the time-variant components of the measured combined residual signals from the repeated measurement. In other words, the timing of the at least two digital channel signals relative to each other may be varied and a respective combined residual signal is obtained by sum-combining or difference-combining the at least two digital channel signals each time. The obtained combined residual signals may be compared with each other in order to detect a minimum or a maximum of the time-variant component, i.e. a minimum or maximum AC signal strength, for example. The detected minimum or maximum may be an indication for a minimal relative time shift or phase shift of the at least two digital channel signals relative to each other. Accordingly, the relative timing of the at least two digital channel signals relative to each other is determined on the basis of the measurement of the combined residual signal, in particular, based on the basis of the above mentioned repeated measurement of the combined residual signal.

According to an embodiment, the measurement of the combined residual signal may comprises performing at least one measurement and determining the magnitude and optionally the sign of the combined residual signal of said at least one measurement. In other words, the at least one measurement may include exactly one or more than one measurement. The presence of a combined residual signal with a time-variant component may be an indication that a relative time shift or phase shift between the at least two digital channel signals may exist. For each measurement the magnitude of the measured combined residual signal may be determined. The magnitude of the measured combined residual signal may be an indication for the magnitude of the relative time shift or phase shift of the at least two digital channel signals relative to each other. Additionally or alternatively, the sign of the combined residual signal may be determined. The sign may be an indication for the time of arrival of the at least two digital channel signals relative to each other, i.e. it may be determined by means of the sign, which one of the at least two digital channel signals has arrived first.

According to an embodiment, at least two digital channel signals which comprise, except for a possible time shift relative to each other, a complementary pattern with respect to their edges are sum-combined, or at least two digital channel signals which comprise, except for a possible time shift relative to each other, an identical pattern with respect to their edges are difference-combined. In other words, if the at least two digital channel signals comprise a complementary pattern, then their respective edges, i.e. rising edge and falling edge, are opposed or mirror-inverted. Stated differently, if the first signal comprises a rising edge, then the complementary second signal comprises a falling edge at the same time instant. Thus, if the at least two digital channel signals comprise such a complementary pattern, then these two signals are added. Conversely, the at least two digital channel signals may comprise an identical pattern, i.e. their respective edges, i.e. rising edge and falling edge, are identical. Stated differently, if the first signal comprises a rising edge, then the complementary second signal also comprises a rising edge at the same time instant. Thus, if the at least two digital channel signals comprise such an identical pattern, then these two signals are subtracted.

According to an embodiment, the at least two digital channel signals may comprise the same amplitude.

According to an embodiment, the step of combining is performed such that the combining provides a combined residual signal without a time-variant component if the at least two digital channel signals have a time shift relative to each other that is zero or an integer multiple of the signal period duration. In an alternative embodiment, the step of combining is performed such that the combining provides a combined residual signal without a time-variant component if the at least two digital channel signals have a phase shift relative to each other that is zero degrees or 180 degrees. In other words, if the at least two digital channel signals comprise a substantially identical timing, i.e. their edges appear at substantially the same time, then the combination of these two signals yields a common combined residual signal that does not have a significant AC portion, i.e. time-variant component. If the at least two digital channel signals may even comprise the same amplitude, then these two signals can advantageously extinct each other upon combination. In result, the combined residual signal does not have a significant AC portion originating from the at least two digital channel signals. These embodiments may be advantageous for repetitive signals which may also comprise an identical duty cycle or a complementary duty cycle. If the term "duty cycle" is defined as the ratio of the time the signal is 'high' to the period time, then identical signals may comprise an identical duty cycle, i.e. if one signal has 40% duty cycle, then an identical second signal also has 40% duty cycle. Complementary signals, instead, may comprise a complementary duty cycle, i.e. if one signal has 40% duty cycle, then the complementary signal has 60% duty cycle. Multiple signal periods may be analyzed with this embodiment of the inventive method.

According to yet another embodiment, the step of combining is performed such that the combining provides a combined residual signal without a time-variant component if a leading edge of one of the at least two digital channel signals appears at the same time as a leading edge of the other one of the at least two digital channel signals. This embodiment may be advantageous for non-repetitive or discontinuous signals which may comprise a different duty cycle. However, at least one signal period may be analyzed with this embodiment of the inventive method.

According to an embodiment, the at least two digital channel signals are repetitive clock signals comprising the same, i.e. an identical duty cycle or a complementary duty cycle. As mentioned above, repetitive signals comprising an identical or complementary duty cycle can be advantageously processed by the inventive method as they can be sum-combined or difference-combined such that they may substantially extinct each other. In result, the combined residual signal does not comprise a significant AC component, even over multiple signal periods.

According to an embodiment, the at least two different channels of the Automated Test Equipment are programmed such that the at least two digital channel signals are generated with a desired predetermined phase shift of 0° or 180° relative to each other, and wherein, if the measured combined residual signal comprises a time variant component that is larger than a threshold value, the method further comprises calibrating the at least two different channels of the Automated Test Equipment by varying the timing of the at least two different channels relative to each other. In other words, the Automated Test Equipment (ATE) generates the at least two digital channel signals such that they have an identical timing, i.e. their edges appear at substantially the same time. However, due to differing signal run times, e.g. induced by differing signal wire lengths, the at least two digital channel signals may arrive at a point of combination (e.g. a connector or pogo pin, DUT socket, etc.) with a certain phase shift or a certain time shift relative to each other. In other words, they may arrive out of sync. Accordingly, when the at least two digital channel signals, which are out of sync, may be combined with each other, the combined residual signal may comprise an AC component that is larger than a threshold value. The threshold value may be a signal strength that makes a significant (i.e. measurable) AC component identifiable and distinguishable from noise. If the combined residual signal comprises such an AC component, this is an indication that the relative timing of the at least two digital channel signals is out of sync. Thus, in order to calibrate the two channels of the ATE, the relative timing of the generated at least two digital channel signals can be varied such that they arrive at the same time at the point of combination. In other words, one of the at least two digital channel signals may be generated and/or transmitted earlier than the other one of the at least two digital channel signals, such that both digital channel signals arrive at substantially the same time at the point of combination. This embodiment may be advantageous for repetitive signals having an identical or complementary duty cycle.

A further embodiment may also be advantageous for non-repetitive or discontinuous signals. According to said embodiment, the at least two different channels of the Automated Test Equipment are programmed such that the at least two digital channel signals are generated with a desired predetermined time shift being zero or an integer multiple of the signal period duration, and wherein, if the measured combined residual signal comprises a time variant component that is larger than a threshold value, the method further comprises calibrating the at least two different channels of the Automated Test Equipment by varying the timing of the at least two different channels relative to each other.

According to yet another embodiment, the step of measuring the combined residual signal comprises measuring the combined residual signal in the frequency domain. It is imaginable that the step of measuring the combined residual signal may comprise determining the power of the combined residual signal and/or the root mean square (RMS) value of the combined residual signal and/or the peak (PK) value of the combined residual signal and/or the peak-to-peak (PP) value of the combined residual signal. Executing the detection in the frequency domain (e.g. measurement of power, rms or peak), is advantageous because very small signals can be measured in the frequency domain easier than in the time domain. Furthermore, a narrowband bandpass filter might be employed in order to reduce the noise.

A second aspect of the invention is directed to a timing calibration unit for an Automated Test Equipment, the timing calibration unit comprising a digital channel interface configured to receive at least two digital channel signals provided by at least two different channels of the Automated Test Equipment, wherein the digital channel signals comprise, except for a possible time shift relative to each other, an identical or a complementary pattern with respect to their edges; a combiner configured to sum-combine or difference-combine the at least two digital channel signals in order to obtain a combined residual signal; wherein the combiner is configured to perform the combining such that the combination provides a combined residual signal without a time-variant component if the at least two digital channel signals have a predetermined time shift or a predetermined phase shift relative to each other, and such that the combined residual signal comprises a time variant component if the two digital channel signals have a time shift different from the predetermined time shift or a phase shift different from the predetermined phase shift; and wherein the timing calibration unit is configured to measure the combined residual signal and to determine a relative timing of the at least two digital channel signals relative to each other on the basis of the measurement of the combined residual signal.

According to an embodiment, if the measured combined residual signal has a time-variant component, the timing calibration unit is configured to calculate from the time-variant component an amount of phase shift or time shift of the at least two digital channel signals relative to each other in order to determine the relative timing of the at least two digital channel signals relative to each other. In other words, if the combined residual signal has a time-variant component, this may indicate that the two digital channel signals, that have been combined, have a time shift or a phase shift relative to each other. This AC component of the combined residual signal can be measured, e.g. its signal strength, signal power, etc. The magnitude of the measured AC signal component may indicate the magnitude of the time shift or phase shift of the two digital channel signals relative to each other. That is, the greater the magnitude of the AC signal component, the greater the relative time shift or phase shift of the at least two digital channel signals relative to each other. The magnitude of the AC signal component may be an indication of the absolute value of the time shift or phase shift of the at least two digital channel signals relative to each other. It may, however, also be possible that the phase of the measured AC signal component may indicate the sign of the time shift or phase shift of the two digital channel signals relative to each other, that means determine which digital signal occurs earlier or later.

According to an embodiment, the timing calibration unit is further configured to adjust the relative timing of the at least two digital channel signals relative to each other such that the measured combined residual signal does not have a time-variant component, or such that the time-variant component is brought below a threshold value, wherein the adjustment is based on the calculated amount of phase shift or time shift of the at least two digital channel signals relative to each other. In other words, the relative time shift or phase shift of the at least two digital channel signals relative to each other has been previously calculated based on the detected magnitude and optionally sign of the combined residual signal. Based on this calculation, the relative timing of the channels of the ATE via which the at least two digital channel signals are transmitted can be adjusted such that the at least two digital channel signals arrive in sync, i.e. at substantially the same time, at the point of combination.

Additionally or alternatively to measuring the AC signal's magnitude and phase and calculating the time shift from these, it may also be possible to search for the minimum magnitude, without measuring the phase of the AC signal, which needs some more effort than just measuring the magnitude. Further, the relation of the absolute value of the magnitude to the value of the time or phase shift does not have to be measured additionally, somehow. It also may be possible to search for the maximum magnitude, whereas the maximum may not be that sharp relative to the time shift as the minimum.

In yet another embodiment, the combining device is configured to sum-combine at least two digital channel signals comprising, except for a possible time shift relative to each other, a complementary pattern with respect to their edges, or to difference-combine at least two digital channel signals comprising, except for a possible time shift relative to each other, an identical pattern with respect to their edges. As mentioned above, adding or subtracting the at least two digital channel signals may depend on their signal form, wherein the combination may be done such that the at least two digital channel signals substantially extinct each other.

According to an embodiment, the combiner comprises an operational amplifier that is circuited as a summing amplifier or as a differential amplifier. Accordingly, the combination of the at least two digital channel signals is executed by a suitable operational amplifier circuit. The operational amplifier circuit may either add or subtract the at least two digital channel signals. Two digital channel signals comprising an identical signal pattern may be subtracted, while two digital channel signals comprising a complementary signal pattern may be added.

According to an embodiment, a low-pass filter or a bandpass filter may be connected to the input and/or the output of the operational amplifier. The low-pass filter has the purpose to keep away potentially very fast signals from the potentially slower operational amplifier. As a side effect, some noise is reduced. A narrow bandpass filter at the output or as part of the measurement block has two purposes: Noise reduction and filtering just the base rate of the signal. Just like a spectrum analyzer does it. Accordingly, noise can be reduced or eliminated such that an AC component of the combined residual signal may be reliably detectable.

According to an embodiment, the combination of the at least two digital channel signals may be performed at an input of the low-pass or the bandpass filter, and the output of the low-pass filter may be coupled to an input of the operational amplifier. In other words, the filter may be arranged between a point of combination of the at least two digital channel signals and the operational amplifier circuit.

According to a third aspect of the invention, a calibratable Automated Test Equipment is provided which comprises a digital channel signal generator configured to generate and to provide at least two digital channel signals by at least two different channels; wherein the digital channel signals comprise, except for a possible time shift relative to each other, an identical or a complementary pattern with respect to their edges; and a timing calibration unit according to the previously mentioned embodiments.

According to a fourth aspect of the invention, a method for calibrating an Automated Test Equipment for automated testing of a Device Under Test is provided, the method comprising generating at least two digital channel signals, wherein the digital channel signals comprise, except for a possible time shift relative to each other, an identical or a complementary pattern with respect to their edges; receiving a combined residual signal comprising the at least two digital channel signals; analyzing the combined residual signal as to a time-variant component and, if no time-variant component is detected, generating a first information indicating that the at least two digital channel signals have a predetermined time shift or a predetermined phase shift relative to each other, or if a time-variant component is detected, generating a second information indicating that the two digital channel signals have a time shift different from the predetermined time shift or a phase shift different from the predetermined phase shift; and determining a relative timing of the at least two digital channel signals relative to each other based on the magnitude of the analyzed time-variant component.

According to a fifth aspect of the invention, computer programs are provided, wherein each of the computer programs is configured to implement the above-described method when being executed on a computer or signal processor, so that the above-described method is implemented by one of the computer programs.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
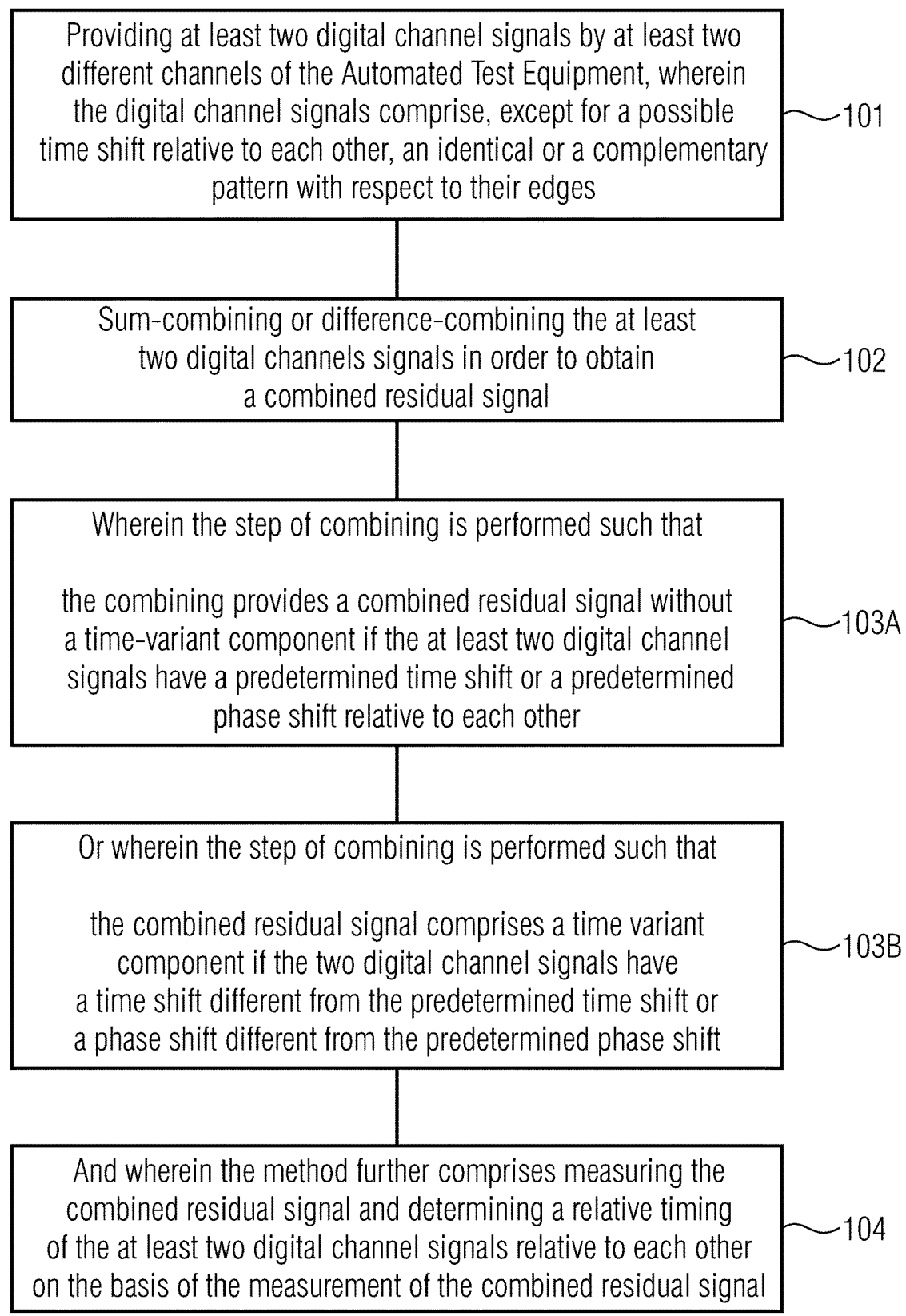
FIG. 1 shows a block diagram of an inventive method according to a first aspect of the invention.

Equal or equivalent elements or elements with equal or equivalent functionality are denoted in the following description by equal or equivalent reference numerals.

FIG. 1 shows a block diagram of an inventive method according to a first aspect of the invention. The block diagram represents an inventive method for calibrating an Automated Test Equipment for automated testing of a Device Under Test.

At block 101 at least two digital channel signals are provided by at least two different channels of the Automated Test Equipment, wherein the digital channel signals comprise, except for a possible time shift relative to each other, an identical or a complementary pattern with respect to their edges.

At block 102 the at least two digital channel signals are sum-combined or difference-combined in order to obtain a combined residual signal.

At block 103A the step of combining is performed such that the combining provides a combined residual signal without a time-variant component if the at least two digital channel signals have a predetermined time shift or a predetermined phase shift relative to each other.

Additionally or alternatively, at block 103B the step of combining is performed such that the combined residual signal comprises a time variant component if the two digital channel signals have a time shift different from the predetermined time shift or a phase shift different from the predetermined phase shift.

At block 104 the combined residual signal is measured and a relative timing of the at least two digital channel signals relative to each other is determined on the basis of the measurement of the combined residual signal.

Said measurement of the combined residual signal, in order to determine a relative timing of the at least two digital channel signals relative to each other, may be performed in different ways. For example, the magnitude of the combined residual signal may be measured. The magnitude of the combined residual signal may be an indication of the magnitude of the relative timing difference between the at least two digital channel signals. Additionally or alternatively, the sign of the combined residual signal may be determined. The sign may be an indication of the time of arrival of a signal, i.e. it may be determined which one of the at least two digital channel signals appeared first. A further example for the measurement of the combined residual signal, in order to determine a relative timing of the at least two digital channel signals relative to each other, may be a repeated measurement. For example, the residual signal may be measured repeatedly with different relative timings of the at least two digital channel signals relative to each other until a minimum or maximum of the measurement is achieved. In other words, the combined residual signal may be measured repeatedly and a relative timing of the at least two digital channel signals relative to each other is determined on the basis of said repeated measurement of the combined residual signal.

Due to the fact that the small ac-signal's magnitude not only depends on the timing skew between the two channels, but also, to some extent, on the physical layout and on what else is connected, it may sometimes not be advantageous to make a conclusion from a measured magnitude to an absolute skew number in seconds and therefore it may be challenging to do the calibration with one measurement. Repeated skew-changing and subsequent measurements until a minimum is found seem to be an advantageous way.

Figure 2:
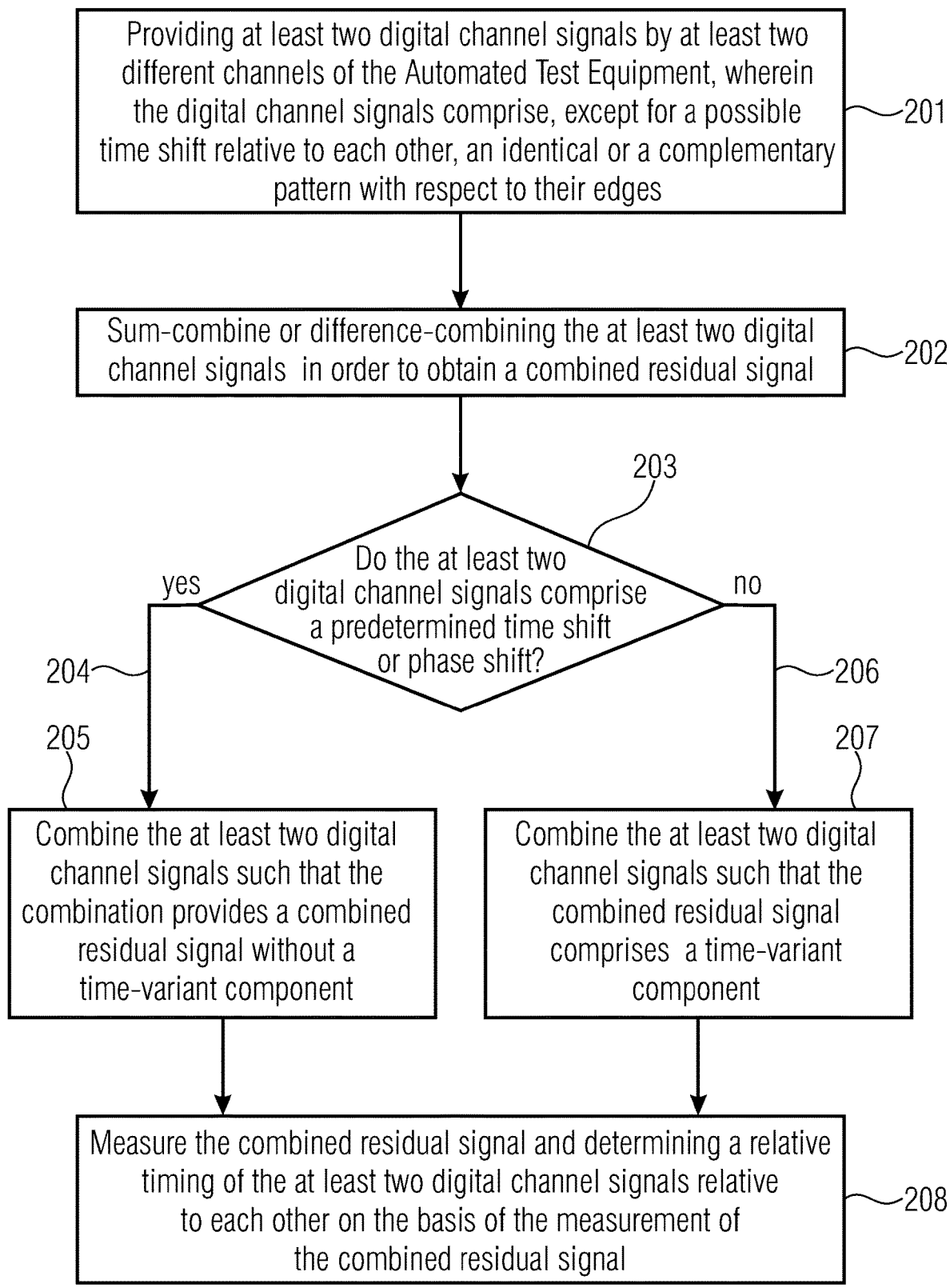
FIG. 2 shows a flow chart of the inventive method according to a first aspect of the invention.

FIG. 2 shows a flow chart of the inventive method according to the first aspect.

At block 201 at least two digital channel signals are provided by at least two different channels of the Automated Test Equipment, wherein the digital channel signals comprise, except for a possible time shift relative to each other, an identical or a complementary pattern with respect to their edges.

At block 202 the at least two digital channel signals are sum-combined or difference-combined in order to obtain a combined residual signal.

Block 203 is a conditional block, where the further execution of the method depends on the signal characteristics of the at least two digital channel signals relative to each other, i.e. the further execution of the method depends on whether or not the at least two digital channel signals comprise a predetermined time shift or a predetermined phase shift relative to each other.

If the at least two digital channel signals comprise a predetermined time shift or phase shift relative to each other, the flow continues at transition 204 which leads to block 205. At block 205 the at least two digital channel signals are combined such that the combination provides a combined residual signal without a significant time-variant component.

If the at least two digital channel signals do not comprise a predetermined time shift or phase shift relative to each other, the flow continues at transition 206 which leads to block 207. At block 207 the at least two digital channel signals are combined such that the combined residual signal comprise a time-variant component.

In both cases, the further execution of the method continues at block 208. At block 208 the combined residual signal is measured and a relative timing of the at least two digital channel signals relative to each other is determined on the basis of the measurement or repeated measurement of the combined residual signal. As mentioned above with reference to FIG. 1, said measurement of the combined residual signal may be a single measurement or a repeated measurement. The latter may be used by comparing the results of the repeated measurements against each other in order to find a minimum or maximum of an AC component in the combined residual signal. A detected minimum or maximum may be an indication of a minimum phase shift or time shift, e.g. a predetermined phase shift or time shift, of the at least two digital channel signals relative to each other.

Figure 3:
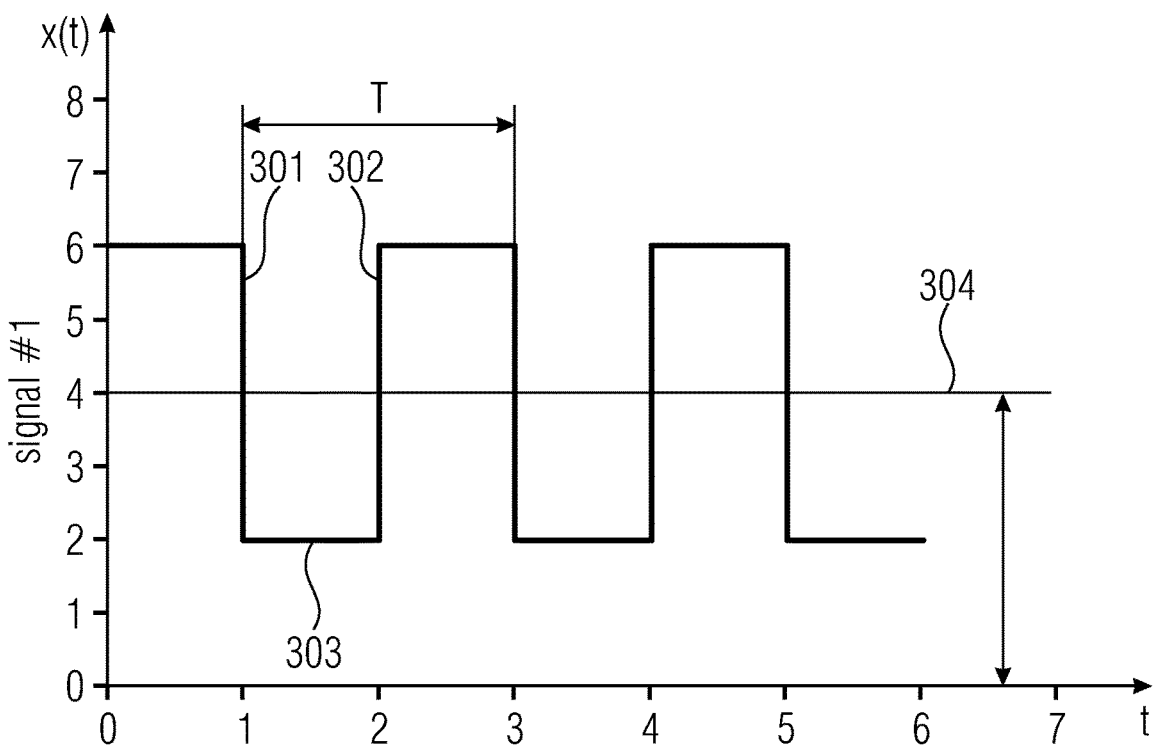
FIG. 3 shows two signals having an identical signal pattern with respect to their edges.
Figure 3:
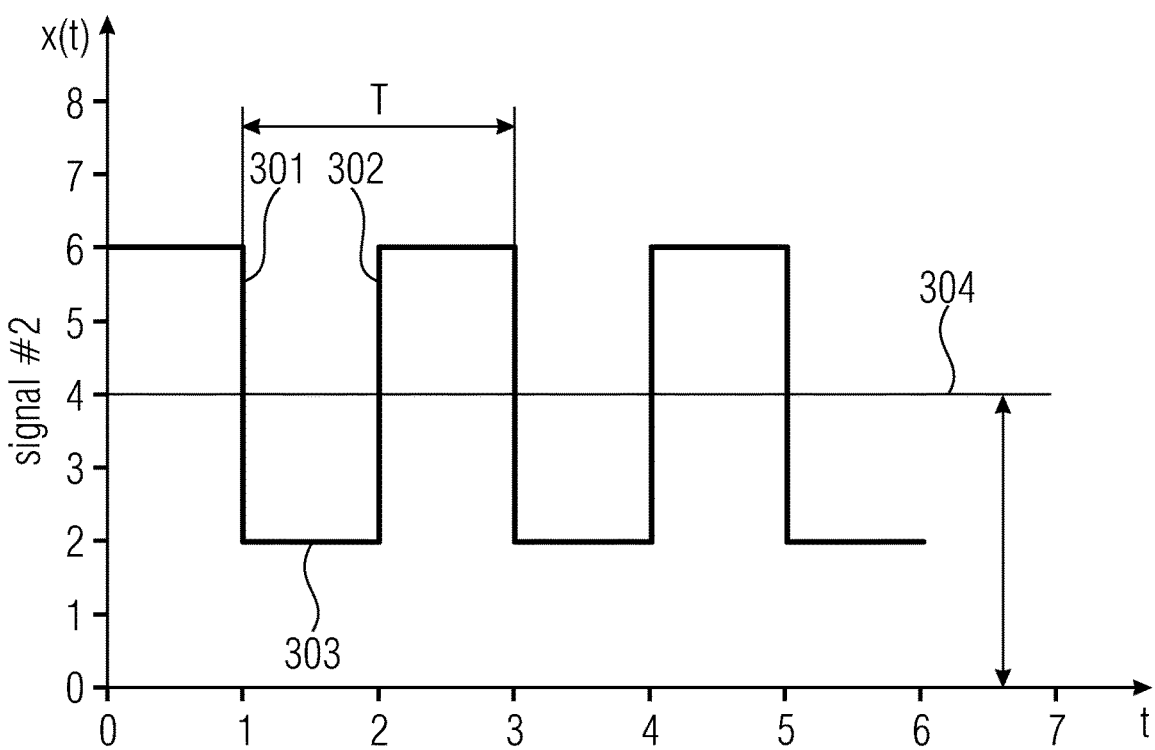
Figure 4:
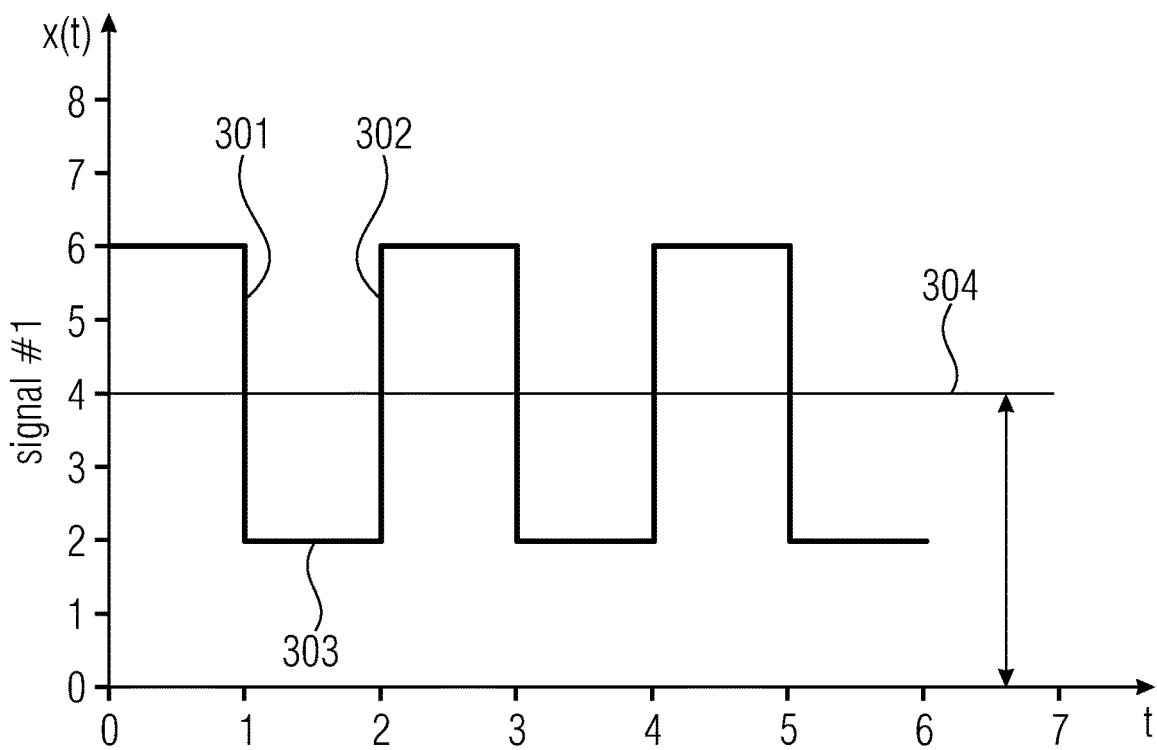
FIG. 4 shows two signals having a complementary signal pattern with respect to their edges.
Figure 4:
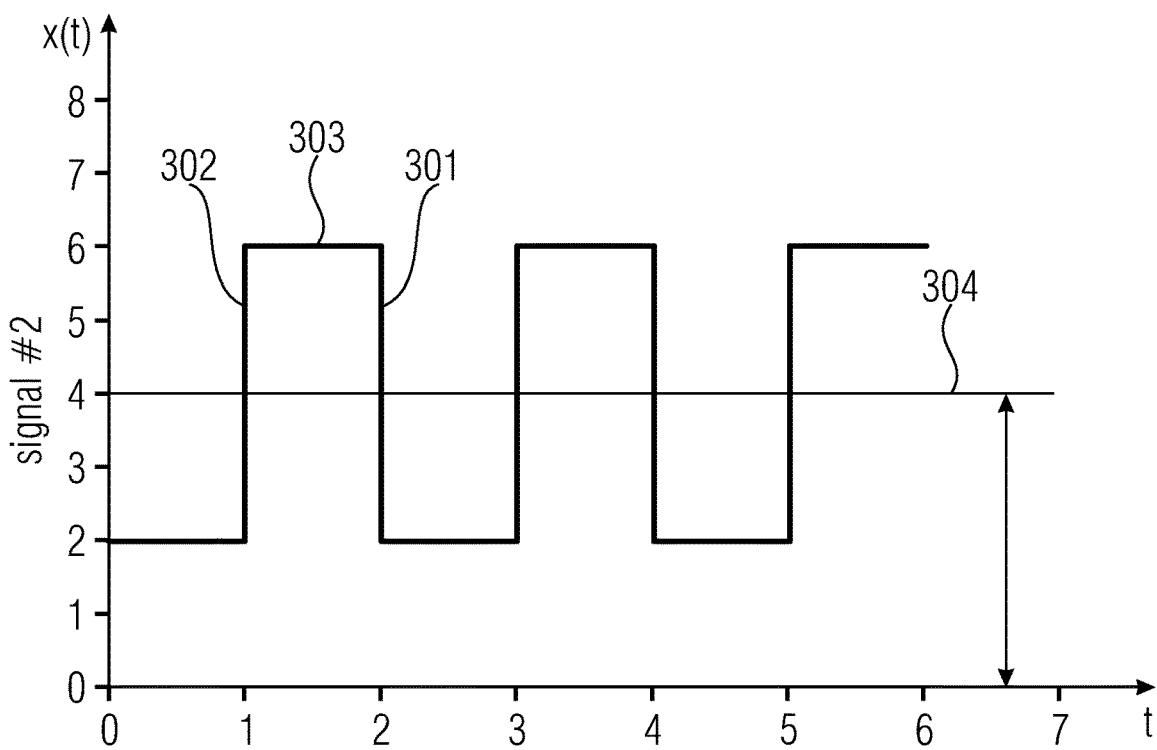

FIGS. 3 and 4 show signal characteristics of the at least two digital channel signals.

FIG. 3 shows the at least two digital channel signals, i.e. Signal #1 in the upper diagram and Signal #2 in the lower diagram, comprising an identical signal pattern with respect to their edges. The signals have a falling edge 301, a rising edge 302 and a steady state 303 extending therebetween. The first edge, i.e. the falling edge 301, may also be referred to as the leading edge. The second edge, i.e. the rising edge 302, may also be referred to as the trailing edge.

A reference value 304, which is also referred to as a DC-offset, may be provided which indicates a zero point. In this case, the zero point 304 is shifted by four digits along the y-axis.

As can further be seen in FIG. 3, Signal #1 (in the upper diagram) and Signal #2 (in the lower diagram) comprise an identical signal pattern with respect to their edges. That is, the falling edge 301 appears at the same time instant in both signals, i.e. Signal #1 and Signal #2. The same applies for the steady state 303 and the rising edge 302.

FIG. 4 shows the at least two digital channel signals, i.e. Signal #1 in the upper diagram and Signal #2 in the lower diagram, comprising a complementary signal pattern with respect to their edges. The signals have a falling edge 301, a rising edge 302 and a steady state 303 extending therebetween. A reference value 304, also referred to as a DC-offset, may be provided which indicates a zero point. In this case, the zero point 304 is shifted by four digits along the y-axis.

As can further be seen in FIG. 1, Signal #1 (in the upper diagram) and Signal #2 (in the lower diagram) comprise a complementary signal pattern with respect to their edges. That is, at a first time instant (t=1), the leading edge of Signal #1 is a falling edge 301, while the leading edge of Signal #2 is a rising edge 302. Between the first time instant (t=1) and a second time instant (t=2), both signals comprise a steady state 303, wherein the steady state 303 of Signal #1 is at low level while the steady state 303 of Signal #2 is at high level. At a second time instant (t=2), the trailing edge of Signal #1 is a rising edge 302, while the trailing edge of Signal #2 is a falling edge 301.

Stated in more general terms, the amplitudes and/or a DC-offset of the at least two digital channel signals may be different, but the edge timing, i.e. the distance between rising edge and falling edge, may be either identical or complementary.

Figure 5:
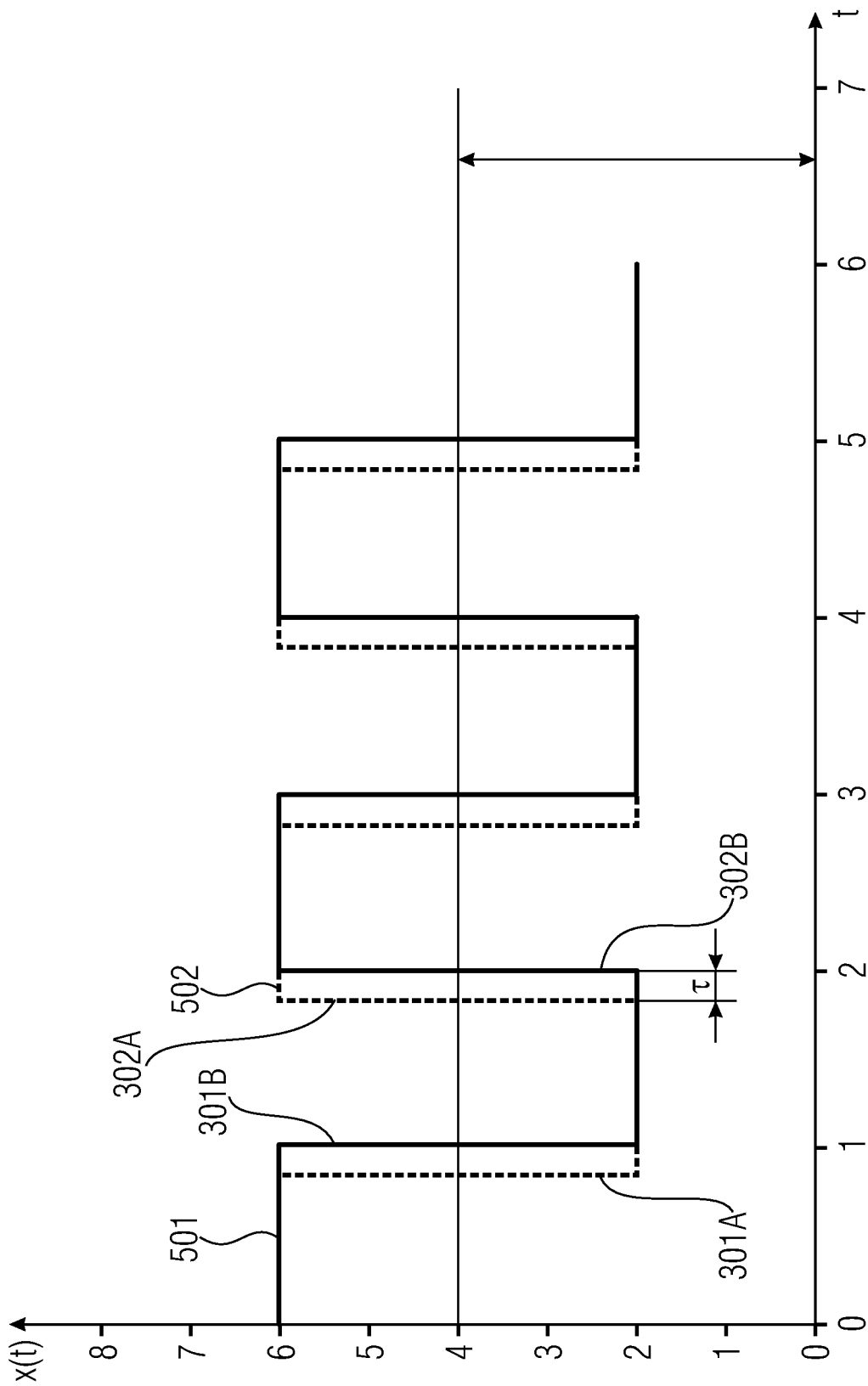
FIG. 5 shows two signals having a relative time shift or a relative phase shift relative to each other.

FIG. 5 shows the at least two digital channel signals 501, 502 drawn in a common diagram, wherein both signals have a relative time shift or phase shift relative to each other. FIG. 5 shows a first digital channel signal 501 and a second digital channel signal 502 (drawn in dashed lines). Both signals 501, 502 have a relative time shift $\tau$ or a relative phase shift $\Delta p$ relative to each other. That is, the falling edge 301A of the second signal 502 appears earlier in time than the falling edge 301B of the first signal 501. As the signals 501, 502 comprise an identical duty cycle, the rising edge 302A of the second signal 502 again appears earlier in time than the rising edge 302B of the first signal 501. The time shift by which the respective edges of the respective signals are shifted relative to each other is referenced in FIG. 5 with the Greek symbol $\tau$ (tau).

The terms phase shift and time shift can be used interchangeably, whereas the phase shift is indicated by an angle in degrees, while the time shift is indicated by a time span in seconds. However, the term phase shift may be commonly used for repetitive signals that may also comprise the same duty cycle, e.g. an identical duty cycle or a complementary duty cycle. The term time shift, however, may rather be used if a second signal is generated, transmitted or received at several time instances later or earlier than a first signal.

With respect to said relative time shift or phase shift, reference is made to FIGS. 3 and 4 again. For example, Signal #1 and Signal #2 which are depicted in FIG. 3 have an identical signal characteristic with respect to their edges. These two signals may also be regarded as having a predetermined time shift of zero or of an integer multiple of the signal period T. Accordingly, a relative time shift of these two signals relative to each other by either zero or by an integer multiple of the signal period T will again result in an identical signal characteristic with respect to the edges, i.e. the failing edges 301 and the rising edges 302 will appear at the same time instants.

In contrast, Signal #1 and Signal #2 as shown in FIG. 4 have a complementary signal characteristic with respect to their edges. These two signals may also be regarded as having a predetermined time shift of 50%, i.e. of a half of an integer multiple of the signal period T. Accordingly, a relative time shift of these two signals relative to each other by 50% of the signal period T will again result in a complementary signal characteristic with respect to the edges.

Figure 6:
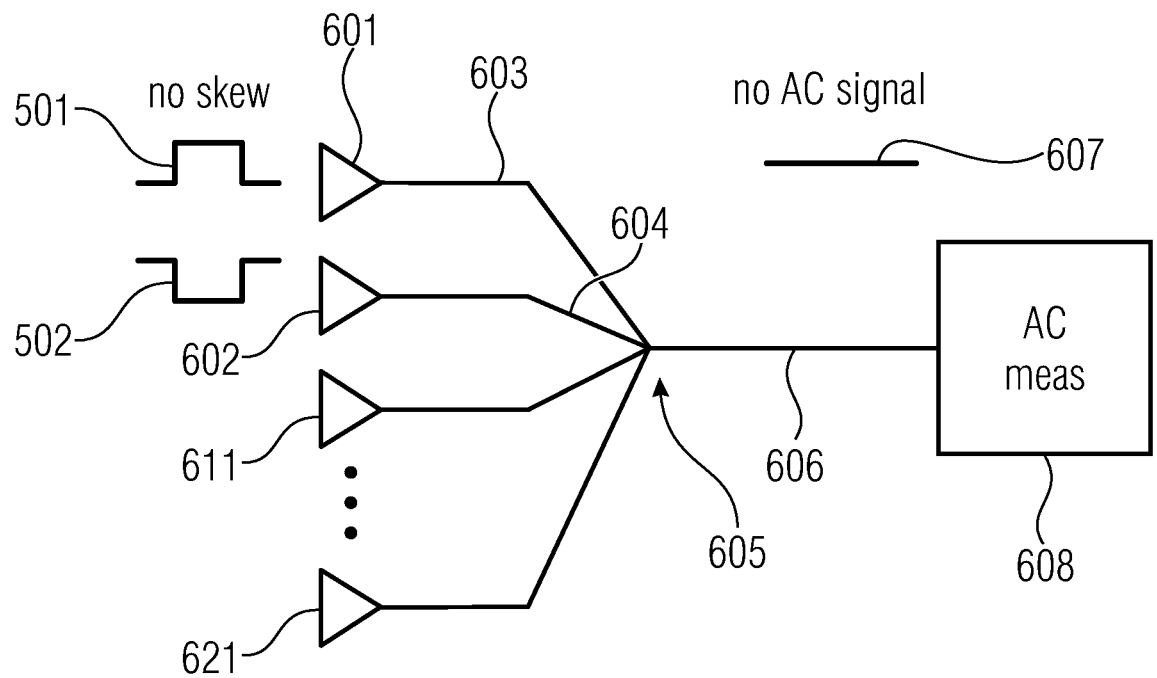
FIG. 6 shows an embodiment of digital channels providing at least two digital channel signals, wherein the combined residual signal does not comprise a time-variant component.
Figure 7:
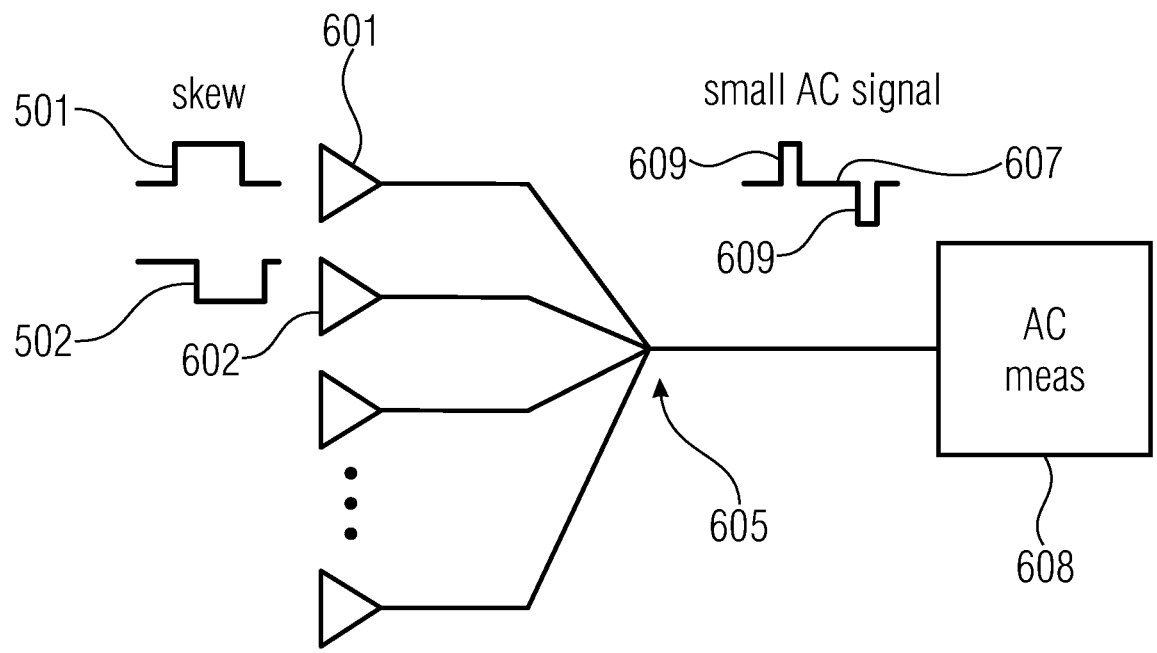
FIG. 7 shows an embodiment of digital channels providing at least two digital channel signals, wherein the combined residual signal comprises a time-variant component.

Reference is now made to FIGS. 6 and 7 which show a simplified and stylized illustration of digital channel signal propagation in an Automated Test Equipment. For the sake of description of the following Figures, the above discussed terms 'time shift' and 'phase shift' of two signals relative to each other may also be subsumed under the more general term skew.

FIG. 6 shows a first channel 601 and a second channel 602. A first digital channel signal 501 is provided by the first channel 601. A second digital channel signal 502 is provided by the second channel 602. However, a third channel 611 and even more channels 621, ranging up to several thousands, may be provided, wherein each of the channels may be configured to provide digital channel signals.

The two digital channel signals 501, 502 are transferred along a digital channel transmission path 603, 604 which may be an electrical path such as a wire or a trace on a circuit board or the like.

The two digital channel signals 501, 502 are transferred to a connection point 605 at which the transmission paths 603, 604 meet. Connection point 605 may be a physical connection point where, for instance, wires 603, 604 are short-circuited. At this connection point 605, the two digital channel signals 603, 604 are combined to a common combined residual signal 607. The combined residual signal 607 is transferred via transmission path 606. The combined residual signal 607 may be measured by a measuring device 608. The measuring device 608 may measure or detect AC signal components in the combined residual signal 607.

Measuring may be performed by measuring the combined residual signal 607 in the frequency domain rather than measuring the combined residual signal 607 in the time domain. For example, the step of measuring the combined residual signal 607 may comprise determining the power of the combined residual signal 607 and/or the root mean square (RMS) value of the combined residual signal 607 and/or the peak (PK) value of the combined residual signal 607 and/or the peak-to-peak (PP) value of the combined residual signal 607.

The ac measurement block 608 may basically perform the function of a spectrum analyzer which finally has a narrow-band filter to reduce noise. However, instead of using a spectrum analyzer, it is suggested to use a simple off-the-shelf logarithmic amplifier which outputs a reasonable DC voltage representing large and very small ac amplitudes.

As can be seen in FIG. 6, the first signal 501 and the second signal 502 may have a complementary timing with respect to their edges without a substantial time shift or phase shift, i.e. they do not comprise skew relative to each other. As a result, the combined residual signal 607 does not comprise an AC signal component because the two digital channel signals 501, 502 substantially extinct each other.

FIG. 7 shows the same arrangement with the difference that the two digital channel signals 501, 502 may still comprise complementary timing with respect to their edges, but they comprise a phase shift or a time shift relative to each other, i.e. they comprise skew relative to each other. In particular, the rising edge of signal 501 appears earlier than the complementary falling edge of signal 502.

When these two signals 501, 502 are combined, the resulting combined residual signal 607 may comprise a time-variant component 609, for example a positive and/or a negative AC signal component 609 as shown in FIG. 7. The magnitude of the AC signal component 609 may depend on what else is connected there.

Figure 8:
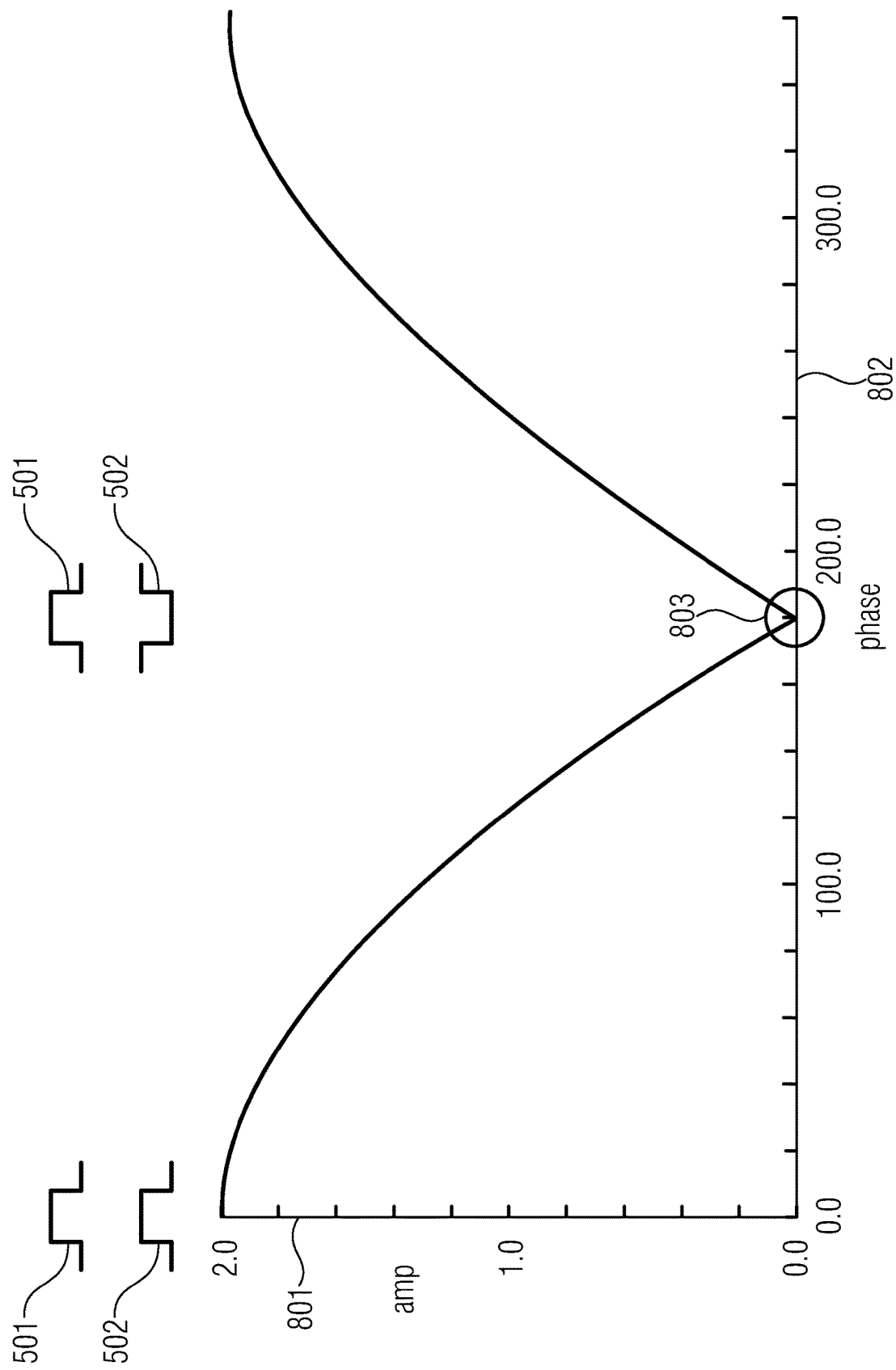
FIG. 8 shows a diagram showing the amplitude of the AC signal over the relative phase shift of two signals.

FIG. 8 shows an example of a resulting relative base AC amplitude 801 versus phase shift 802 between two signals 501, 502. Combining two signals 501, 502 with zero phase shift results in an addition of their amplitudes (signals 501, 502 on the left in FIG. 8). Combining two signals 501, 502 with a phase shift of exactly 180° results in an extinction of their amplitudes (signals 501, 502 in the middle of FIG. 8). As there is a sharp corner 803 at exactly an opposite phase of 180° (in contrary to the situation at zero degrees) this makes it easy to detect a minimum AC amplitude 801 here.

An alternative approach may also possible in which some means of building a sum or a difference are provided instead of adding or subtracting the signals 501, 502 just by shorting them.

Figure 9:
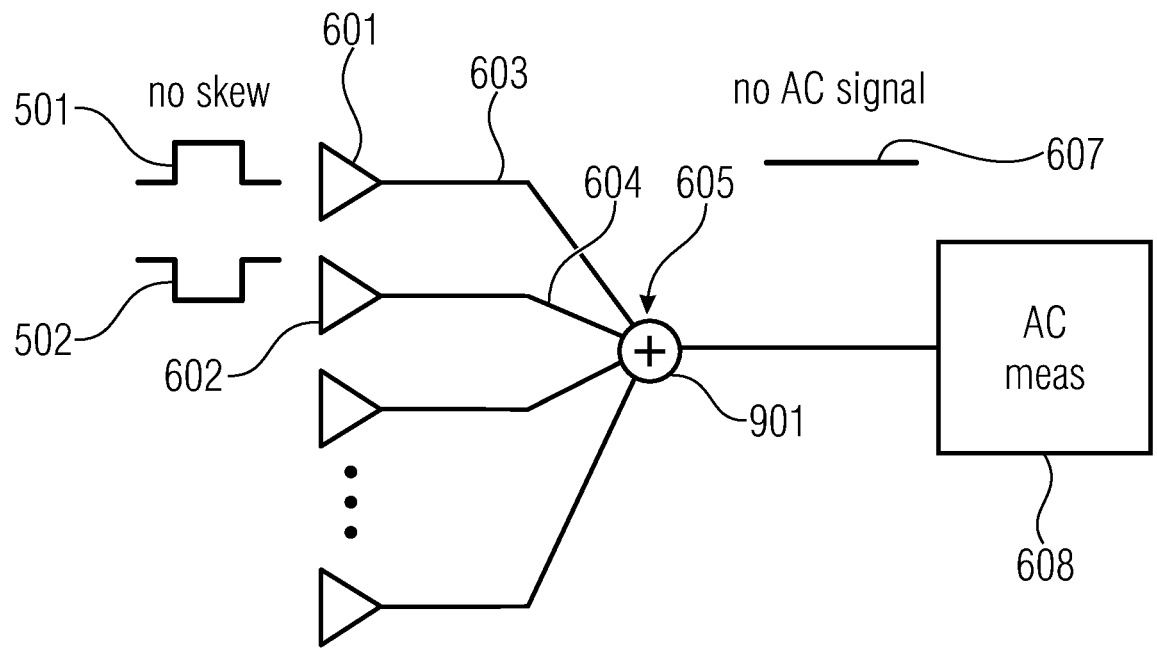
FIG. 9 shows an embodiment of digital channels providing at least two digital channel signals, wherein the sum-combined residual signal does not comprise a time-variant component.
Figure 10:
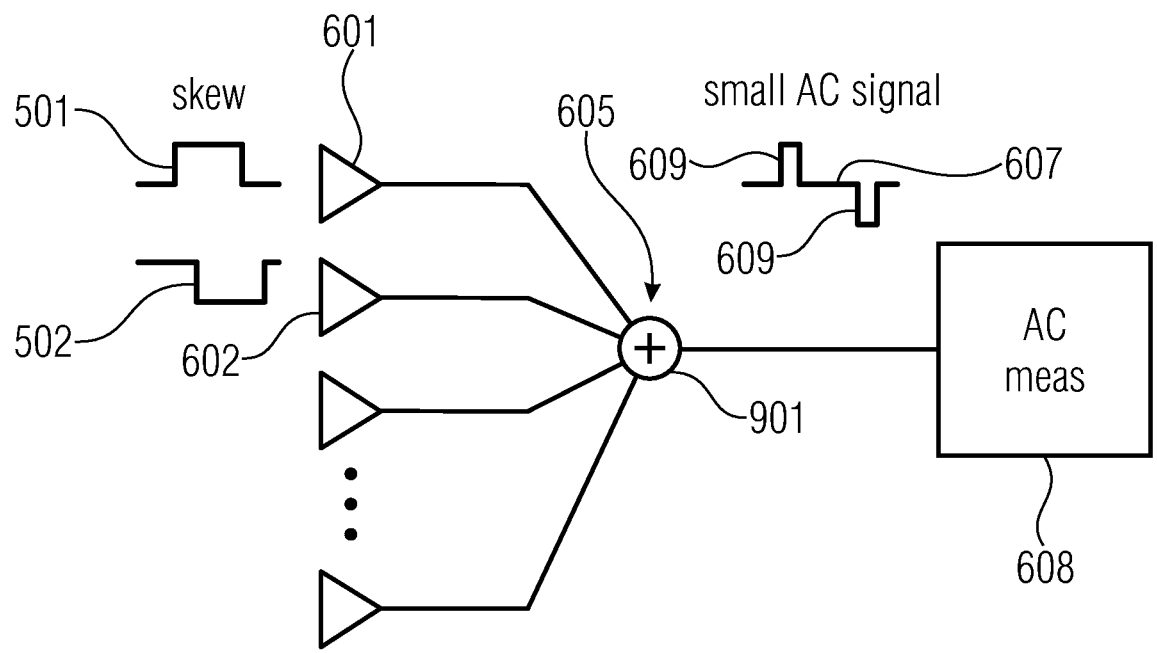
FIG. 10 shows an embodiment of digital channels providing at least two digital channel signals, wherein the sum-combined residual signal comprises a time-variant component.

FIGS. 9 and 10 show an embodiment in which the two digital channel signals 501, 502 are sum-combined. FIGS. 9 and 10 show substantially the same as previously discussed FIGS. 7 and 8, with the difference that a combiner 901 is provided at the connection point 605 at which the two digital channel signals 501, 502 are combined to a common combined residual signal 607. In this embodiment, the combiner 901 is configured to sum-combine, i.e. to add, the two digital channel signals 501, 502. Depending on the relative time shift or phase shift of the two digital channel signals 501, 502 relative to each other, the resulting combined residual signal 607 may comprise no AC signal component (FIG. 9) or the resulting combined residual signal 607 may comprise a measurable AC signal component 609 (FIG. 10).

Figure 11:
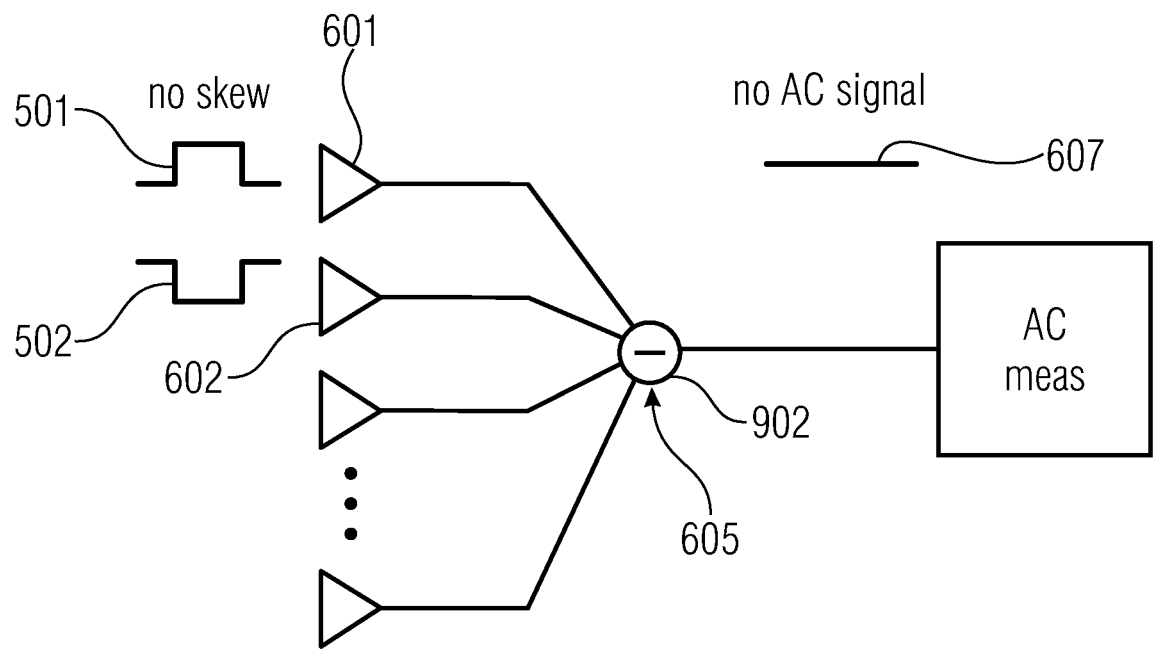
FIG. 11 shows an embodiment of digital channels providing at least two digital channel signals, wherein the difference-combined residual signal does not comprise a time-variant component.
Figure 12:
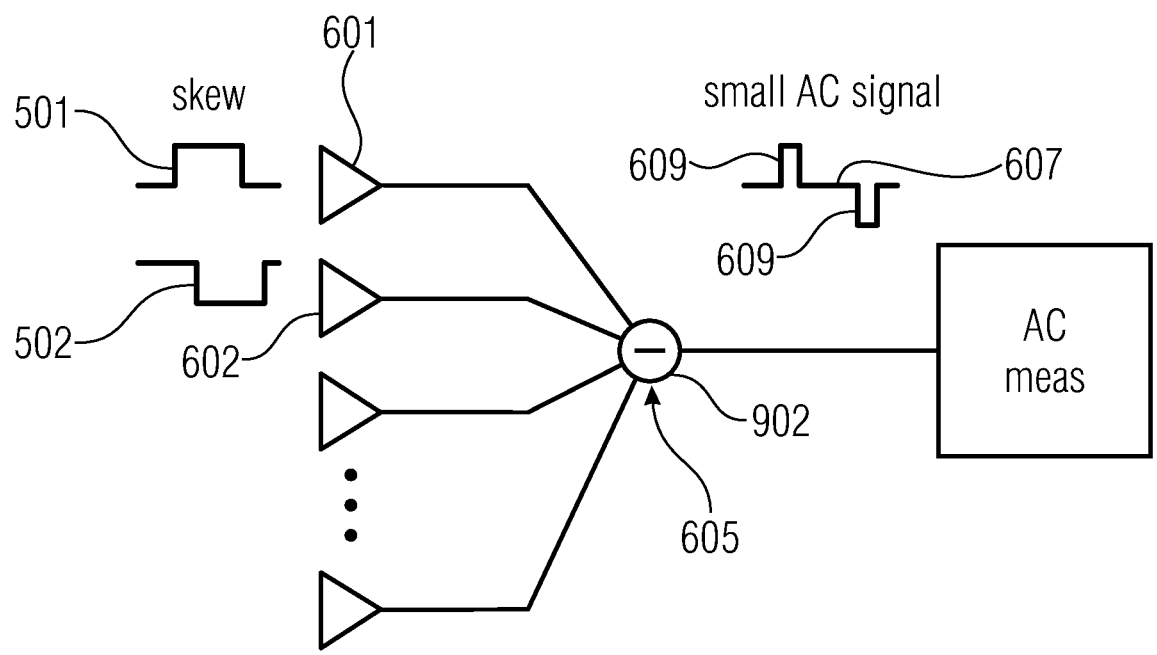
FIG. 12 shows an embodiment of digital channels providing at least two digital channel signals, wherein the difference-combined residual comprises a time-variant component.

FIGS. 11 and 12 show a further embodiment in which the two digital channel signals 501, 502 are difference-combined. Compared to the previously discussed embodiments, the two digital channel signal 501, 501 comprise an identical pattern with respect to their edges.

FIGS. 11 and 12 show substantially the same as previously discussed FIGS. 9 and 10, with the difference that the combiner 902 that is provided at the connection point 605 at which the two digital channel signals 501, 502 are combined to a common combined residual signal 607, is configured to difference-combine, i.e. to subtract, the two digital channel signals 501, 502. Depending on the relative time shift or phase shift of the two digital channel signals 501, 502 relative to each other, the resulting combined residual signal 607 may comprise no AC signal component (FIG. 11) or the resulting combined residual signal 607 may comprise a measurable AC signal component 609 (FIG. 12).

Summarizing, at least two digital channel signals 501, 502 which comprise, except for a possible time shift relative to each other, a complementary pattern with respect to their edges are sum-combined, while at least two digital channel signals 501, 502 which comprise, except for a possible time shift relative to each other, an identical pattern with respect to their edges are difference-combined.

With respect to FIGS. 9 and 11, it can be summarized that the step of combining, i.e. adding or subtracting, is performed such that the combining, i.e. the addition or the subtraction, provides a combined residual signal 607 without a time-variant component if the at least two digital channel signals 501, 502 have a time shift relative to each other that is zero or an integer multiple of the signal period duration, or if the at least two digital channel signals 501, 502 have a phase shift relative to each other that is zero degrees or 180 degrees, respectively.

Still with reference to FIGS. 9 and 11, but stated in more general terms, the step of combining, i.e. adding or subtracting, is performed such that the combining, i.e. the addition or the subtraction, provides a combined residual signal 607 without a time-variant component if a leading edge of one of the at least two digital channel signals 501, 502 appears at the same time as a leading edge of the other one of the at least two digital channel signals 501, 502.

The at least two digital channel signals 501, 502 may be repetitive clock signals comprising the same duty cycle, e.g. an identical duty cycle or a complementary duty cycle.

With the knowledge of the details that have been discussed so far, the inventive method can be used for calibrating the channels 601, 602 which provide the at least two digital channel signals 501, 502.

According to an embodiment, the at least two different channels 601, 602 of the Automated Test Equipment are programmed such that the at least two digital channel signals 501, 502 are generated with a desired predetermined phase shift of 0° or 180° relative to each other, and wherein, if the measured combined residual signal 607 comprises a time variant component 609 that is larger than a threshold value, the method further comprises calibrating the at least two different channels 601, 602 of the Automated Test Equipment by varying the timing of the at least two different channels 601, 602 relative to each other.

The same is true for digital channel signals 501, 502 comprising a desired predetermined time shift relative to each other rather than a certain predetermined phase shift relative to each other. According to this embodiment, the at least two different channels 601, 602 of the Automated Test Equipment are programmed such that the at least two digital channel signals 501, 502 are generated with a desired predetermined time shift being zero or an integer multiple of the signal period duration, and wherein, if the measured combined residual signal 607 comprises a time variant component 609 that is larger than a threshold value, the method further comprises calibrating the at least two different channels 601, 602 of the Automated Test Equipment by varying the timing of the at least two different channels 601, 602 relative to each other.

This shall be explained in more detail with reference to FIGS. 9 and 10 again. As can be seen in FIG. 9, the at least two different channels 601, 602 of the Automated Test Equipment are programmed such that the at least two digital channel signals 501, 502 are generated with a desired predetermined phase shift of 0° or 180° relative to each other (or with a desired predetermined time shift being zero or an integer multiple of the signal period duration, respectively). In other words, their leading edges appear at substantially the same time.

However, due to different signal run times, for instance in the transmission paths 603, 604, the timing of the two digital channel signals 501, 502 may be out of sync, i.e. they may arrive at the connection point 605 at different points in time.

In other words, the two digital channel signals 501, 502 may comprise a time shift or a phase shift relative to each other, when they arrive at the connection point 605.

Thus, when combining, i.e. adding, the two digital channel signals 501, 502, the resulting combined residual signal 607 may comprise an AC signal component 609, which can be measured, for example, by means of the measuring device 608. A threshold value may be determined that indicates a minimum of signal strength that the AC signal component has to comprise in order to be detectable as such. Primarily depending on the sensitivity of the hardware, said threshold value may also be determined as having a zero value. That is, if the measured combined residual signal 607 has an AC component 609 comprising a signal strength or amplitude different from zero (i.e. threshold value), this may be an indication that the two digital channel signals 501, 502 have a time shift or phase shift relative to each other when they arrived at the connection point 605.

Thus, if the measured combined residual signal 607 comprises a time variant component 609 that is larger than the threshold value (e.g. zero), the method further comprises calibrating the at least two different channels 601, 602 of the Automated Test Equipment by varying the timing of the at least two different channels 601, 602 relative to each other.

Accordingly, the timing of the channels 601, 602 is calibrated or adjusted such that they provide two digital channel signals 501, 502 having a time shift or a phase shift relative to each other that is selected such that the two digital channel signals 501, 502 arrive at substantially the same time at the connection point 605. In other words, the calculated time shift or phase shift compensates the run time differences of the two digital channel signals 501, 502. This compensating time shift or phase shift may also be referred to as a predetermined time shift or phase shift.

Accordingly, the step of combining the at least two digital channel signals 501, 502 according to a first aspect of the invention is performed such that the combining provides a combined residual signal 607 without a time-variant component 609 if the at least two digital channel signals 501, 502 have a predetermined time shift r or a predetermined phase shift Δp relative to each other, or such that the combined residual signal 607 comprises a time variant component 609 if the two digital channel signals 501, 502 have a time shift τ different from the predetermined time shift or a phase shift Δp different from the predetermined phase shift.

Figure 13:
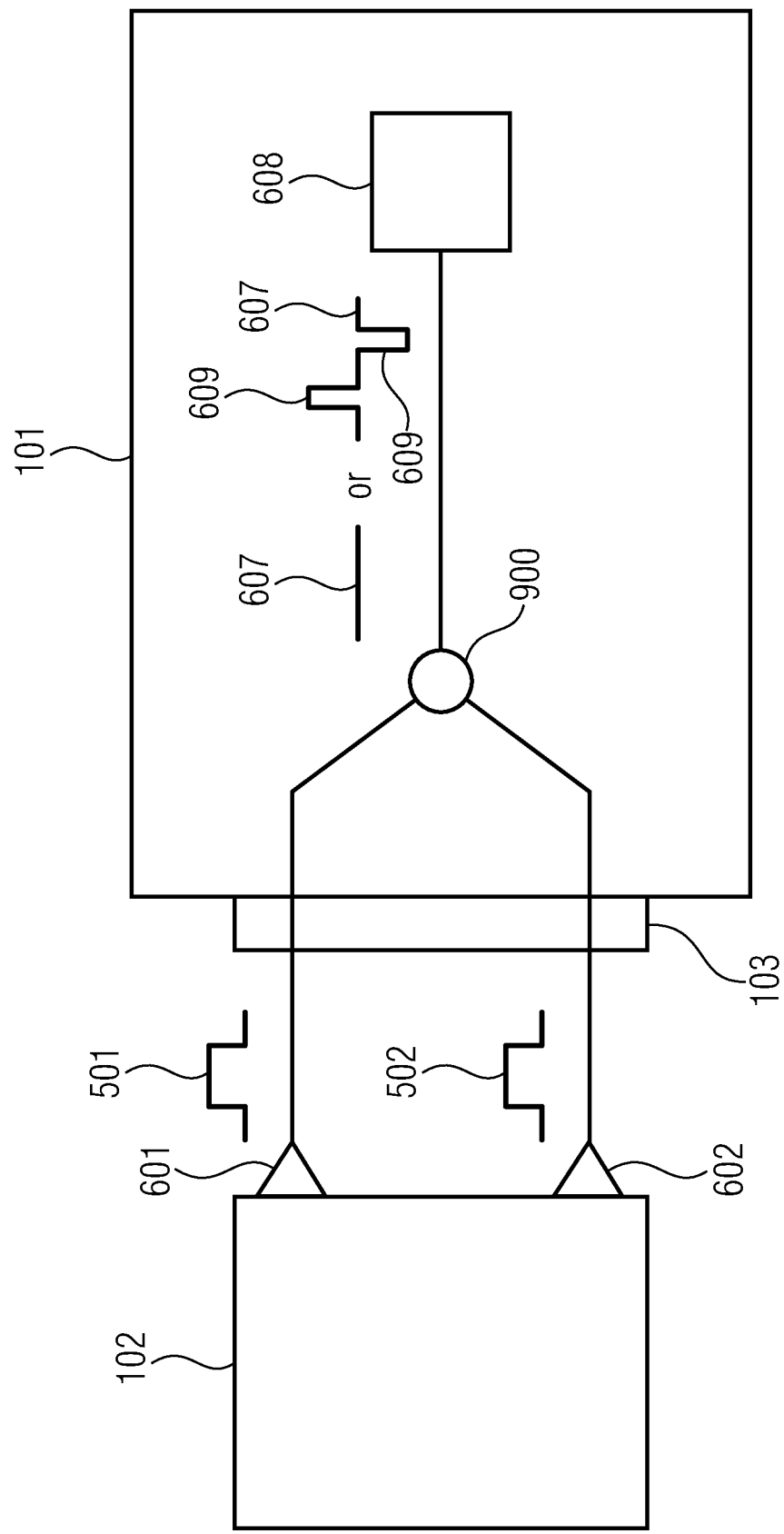
FIG. 13 shows a block diagram of a calibration timing unit for an ATE according to an aspect of the invention.

FIG. 13 shows a block diagram of a timing calibration unit 101 for an Automated Test Equipment 102 according to a second aspect of the invention.

The timing calibration unit 101 comprises a digital channel interface 103 configured to receive at least two digital channel signals 501, 502 provided by at least two different channels 601, 602 of the Automated Test Equipment 102. The digital channel signals 501, 502 comprise, except for a possible time shift relative to each other, an identical or a complementary pattern with respect to their edges.

The timing calibration unit 101 further comprises a combiner 900 configured to sum-combine or difference-combine the at least two digital channel signals 501, 502 in order to obtain a combined residual signal 607. The combiner 900 is configured to perform the combining such that the combination provides a combined residual signal 607 without a time-variant component if the at least two digital channel signals 501, 502 have a predetermined time shift or a predetermined phase shift relative to each other.

The combiner 900 is further configured to perform the combining such that the combined residual signal 607 comprises a time variant component 609 if the two digital channel signals 501, 502 have a time shift different from the predetermined time shift or a phase shift different from the predetermined phase shift.

The timing calibration unit 101 is further configured to measure the combined residual signal 607, e.g. by means of a measurement device 608, and to determine a relative timing of the at least two digital channel signals 501, 502 relative to each other on the basis of the measurement of the combined residual signal 607.

If the measurement yields a combined residual signal 607 that has a time-variant component 609, then the timing calibration unit 101 is configured to calculate from the time-variant component 609 an amount of phase shift or time shift of the at least two digital channel signals 501, 502 relative to each other in order to determine the relative timing of the at least two digital channel signals 501, 502 relative to each other. In other words, the magnitude of the AC component 609 is an indicator for the magnitude of the relative time shift or the relative phase shift of the at least two digital channel signals 501, 502 relative to each other.

Additionally or alternatively, the timing calibration unit 101 may be configured to repeatedly measure the combined residual signal. For example, the relative timing between the at least two digital channel signals 501, 502 may be varied. For each different timing, a respective residual signal 607 may result and be measured by the calibration unit 101. The calibration unit 101 may be configured to compare these several combined residual signals 607 with each other and to determine a minimum or a maximum of the respective AC component of the respective residual signal 607. For example, the detection of a minimum AC component within a certain residual signal 607 may be an indication that these at least two digital channel signals 501, 502 which were combined in order to obtain said certain residual signal 607 may comprise a minimum time shift or phase shift relative to each other, compared to the other measurements, i.e. compared to other residual signals 607 obtained by combining at least two digital channel signals 501, 502 having a different timing relative to each other.

The timing calibration unit 101 is further configured to calibrate the at least two channels 601, 602 of the ATE, i.e. to adjust the relative timing of the at least two digital channel signals 501, 502 relative to each other such that the measured combined residual signal 607 does not have a time-variant component 609, or such that the time-variant component 609 is brought at or below a threshold value (which might be zero, as discussed above), wherein the adjustment is based on the calculated amount of phase shift or time shift of the at least two digital channel signals 501, 502 relative to each other.

The combining device 900 is configured to sum-combine at least two digital channel signals 501, 502 comprising, except for a possible time shift relative to each other, a complementary pattern with respect to their edges, or to difference-combine at least two digital channel signals 501, 502 comprising, except for a possible time shift relative to each other, an identical pattern with respect to their edges.

Figure 14:
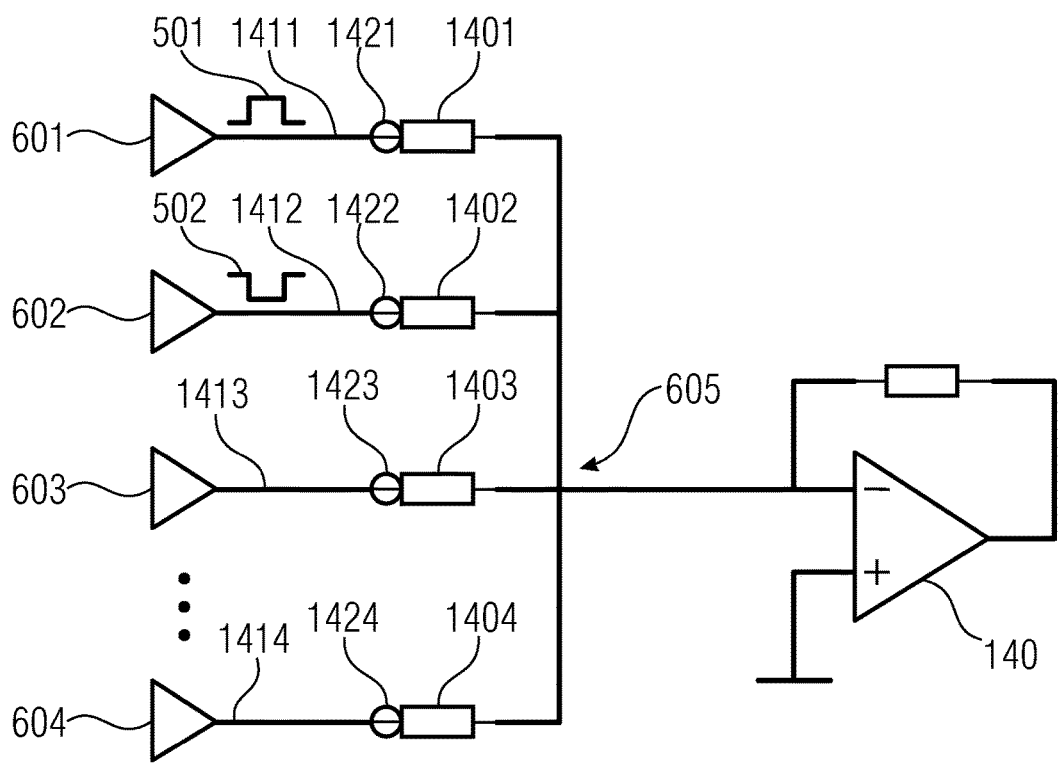
FIG. 14 shows an embodiment of an operational amplifier circuit for combining the at least two digital channel signals.

As shown in FIG. 14, the combiner 900 may comprise an operational amplifier 140. In FIG. 14, the operational amplifier 140 is circuited as a summing amplifier. The summing amplifier 140 may be configured to add the two digital channel signals 501, 502 as they comprise a complementary pattern with respect to their edges.

However, the operational amplifier 140 may also be circuited as a differential amplifier. In this case, the differential amplifier 140 may be configured to subtract the two digital channel signals 501, 502 if they comprise an identical pattern with respect to their edges.

FIG. 14 also shows, by way of example, resistors 1401, 1402, 1403, 1404 which are arranged between the digital channel drivers 601, 602, 603, 604 and the amplifier 140. The resistors 1401, 1402, 1403, 1404 may represent a system boundary of the ATE and the calibration unit, wherein the left side of the resistors 1401, 1402, 1402, 1403 may represent the ATE site and the right side of the resistors 1401, 1402, 1402, 1403 may represent the calibration unit site. The left side of the resistors 1401, 1402, 1403, 1404 is the point where it is desired to have no or only a predetermined relative phase shift or relative time shift between the at least two digital channel signals.

Physical wire connections, such as conventional cables, 1411, 1412, 1413, 1414 may be arranged between the physical drivers 601, 602, 603, 604 and the exemplary resistors 1401, 1402, 1403, 1404. Contact points 1421, 1422, 1423, 1424 may be arranged between the drivers 601, 602, 603, 604 and the exemplary resistors 1401, 1402, 1402, 1403 which may allow to access the signals at the outside world. For example, any type of a connector, pogo pin or DUT socket may be provided as a contact point 1421, 1422, 1423, 1424.

Figure 15:
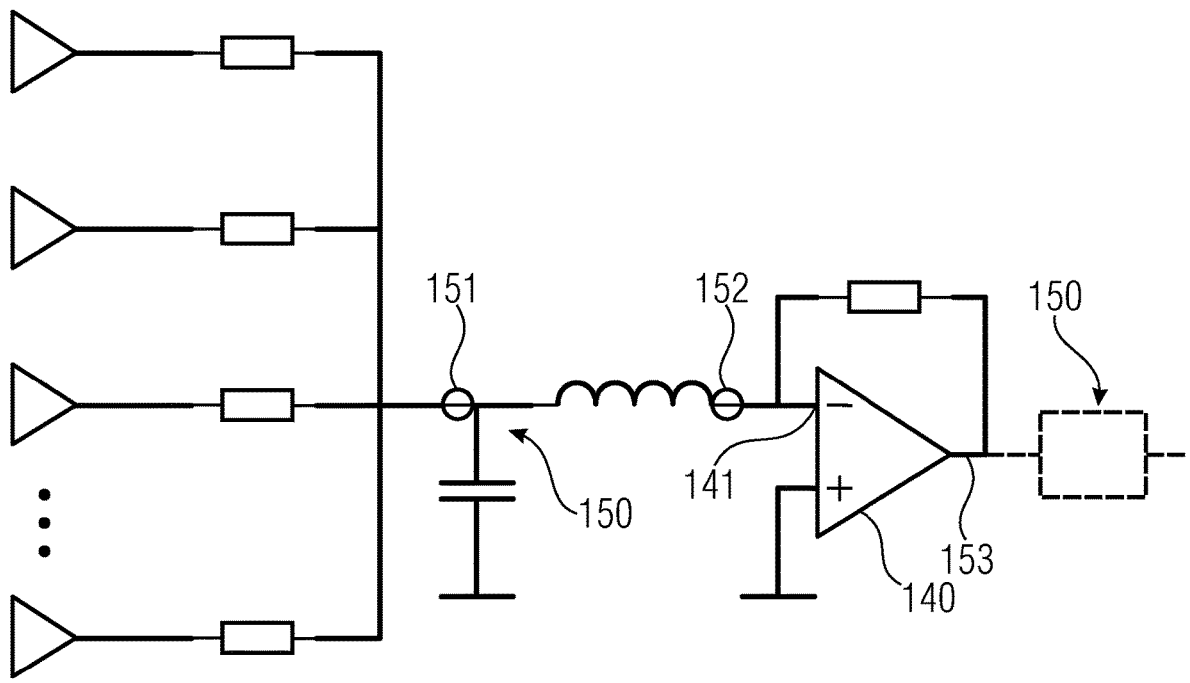
FIG. 15 shows an embodiment of an operational amplifier circuit for combining the at least two digital channel signals with an additional low pass filter.

As shown in FIG. 15 a low-pass filter 150 or a bandpass filter 150, e.g. a narrowband bandpass filter, may be connected to an input 141 and/or to an output 153 of the operational amplifier 140 in order to reduce noise. In FIG. 15, the filter element 150 is exemplarily depicted at the input 141 of the operational amplifier 140. Additionally or alternatively, a filter element 150 may be connected at the output 153 of the amplifier 140 as indicated by dashed lines in FIG. 15.

The filter 150 as depicted at the input 141 of the operational amplifier 141 may be used to limit high frequency noise and the signal speed for the operational amplifier 141, because operational amplifiers may not be able to handle very fast edges from the ATE.

Furthermore, the combination of the at least two digital channel signals 501, 502 may be performed at an input 151 of the low-pass filter 150 or of the bandpass filter 150, wherein the output 152 of the low-pass filter 150 or of the bandpass filter 150 is coupled to an input 141 of the operational amplifier 140.

Figure 16:
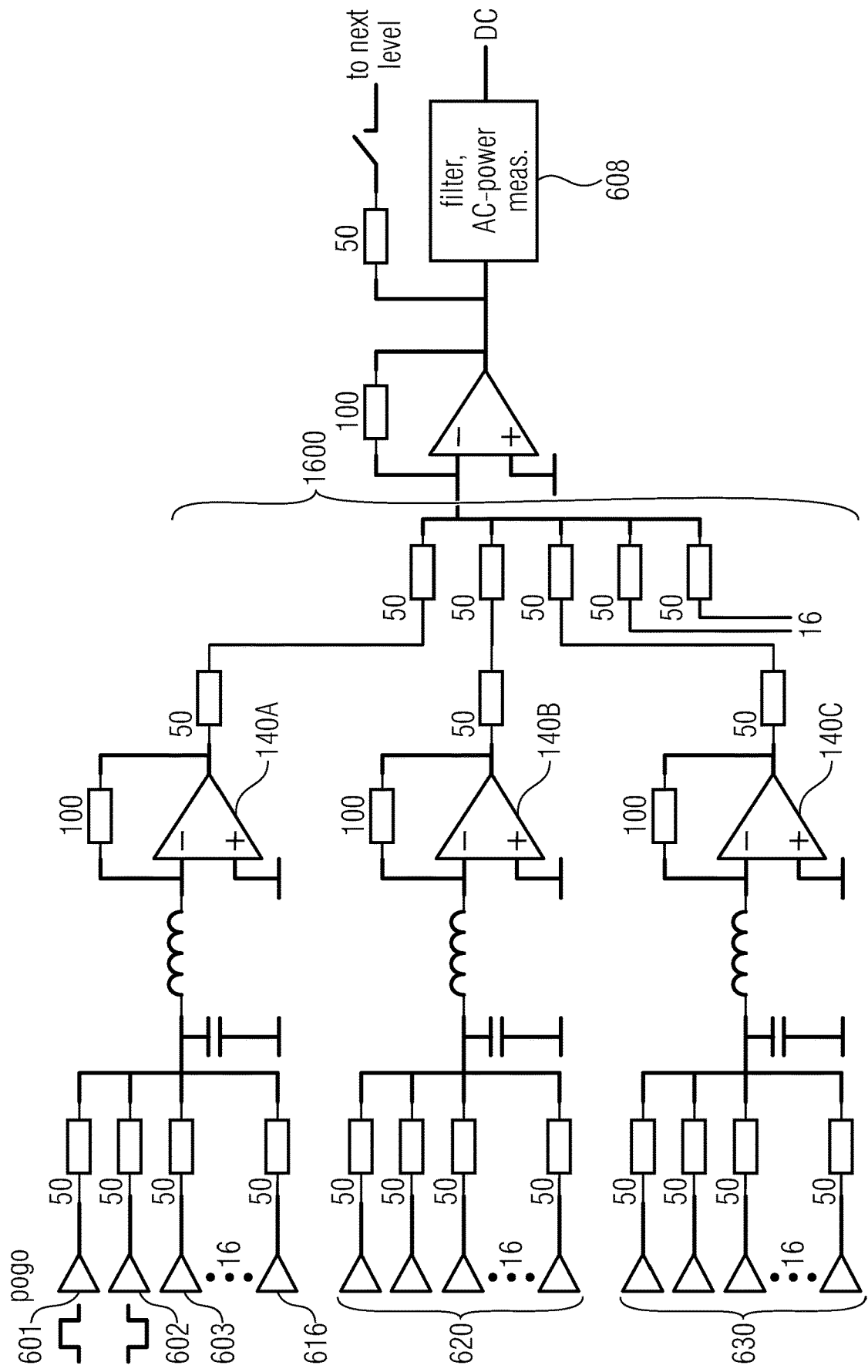
FIG. 16 shows a cascaded operational amplifier circuit.

As can be seen in FIG. 16, in case one operational amplifier circuit 140 handles 16 channels 601, 602, 603, . . . , 616, then adding a second level 620, or even a third level 630, by cascading operational amplifiers 140A, 140B, 140C increases the number of channels to 256. This may also be referred to as a "calibration cell" 1600.

Each additional level multiplies the number of channels served by n (16 in this example). However, it makes sense to have one AC measurement circuit 608 available for a limited number of channels in order to enable parallel calibration of all the calibration cells and having switches (e.g. solid state) to combine them for the next level.

Figure 17:
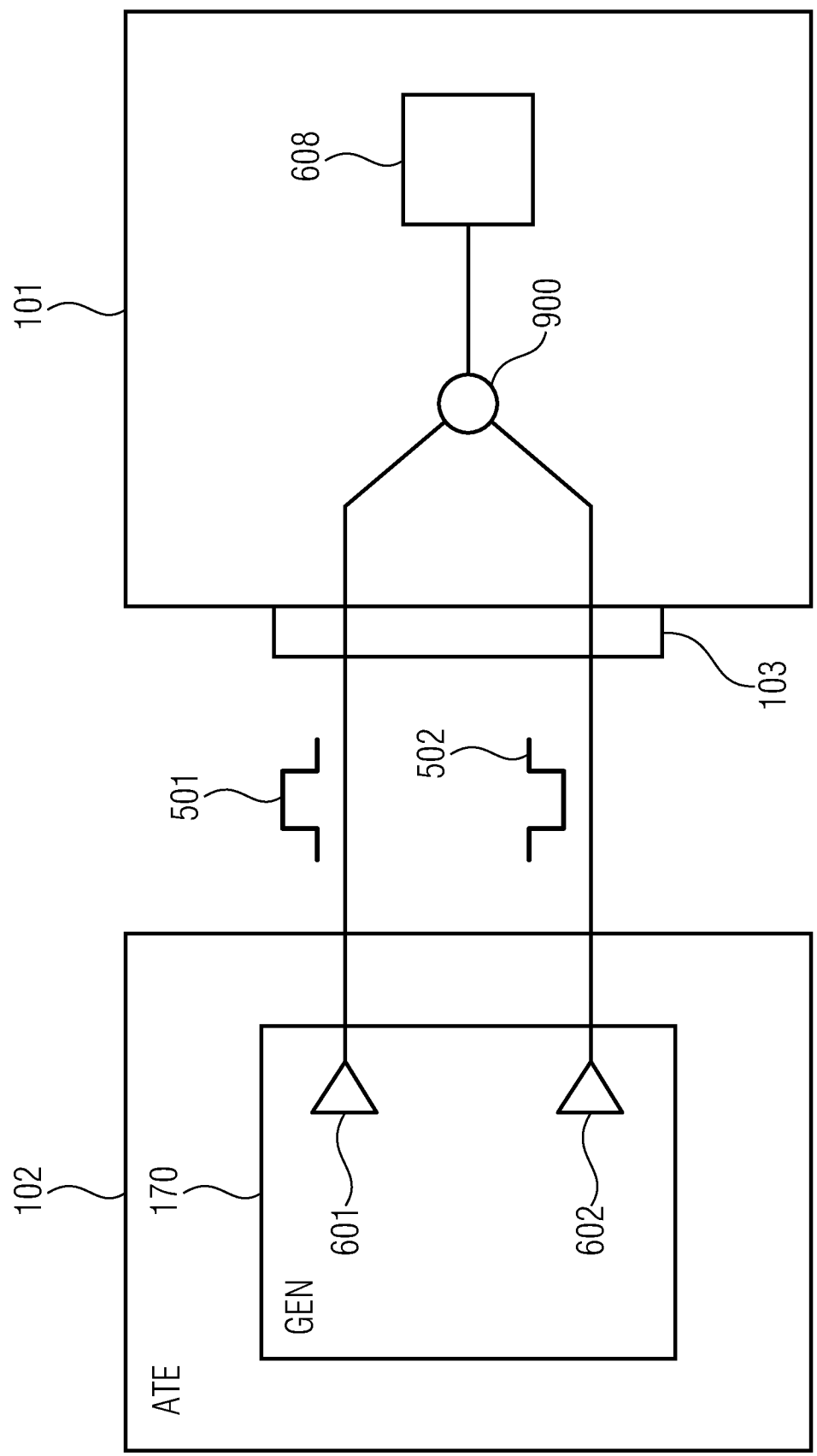
FIG. 17 shows an ATE with a calibration timing unit according to an aspect of the invention.

According to a third aspect of the invention, a calibratable Automated Test Equipment is provided. As can be seen in FIG. 17, the calibratable Automated Test Equipment comprises a digital channel signal generator 170 configured to generate and to provide at least two digital channel signals 501, 502 by at least two different channels 601, 602.

The digital channel signals 501, 502 comprise, except for a possible time shift τ relative to each other, an identical or a complementary pattern with respect to their edges. In FIG. 17, the digital channel signals 501, 502 comprise a complementary signal pattern with respect to their edges, while in FIG. 13, for instance, the digital channel signals 501, 502 comprise an identical signal pattern with respect to their edges.

The calibratable Automated Test Equipment further comprises a timing calibration unit 101, as previously described in more detail with reference to FIG. 13.

Figure 18:
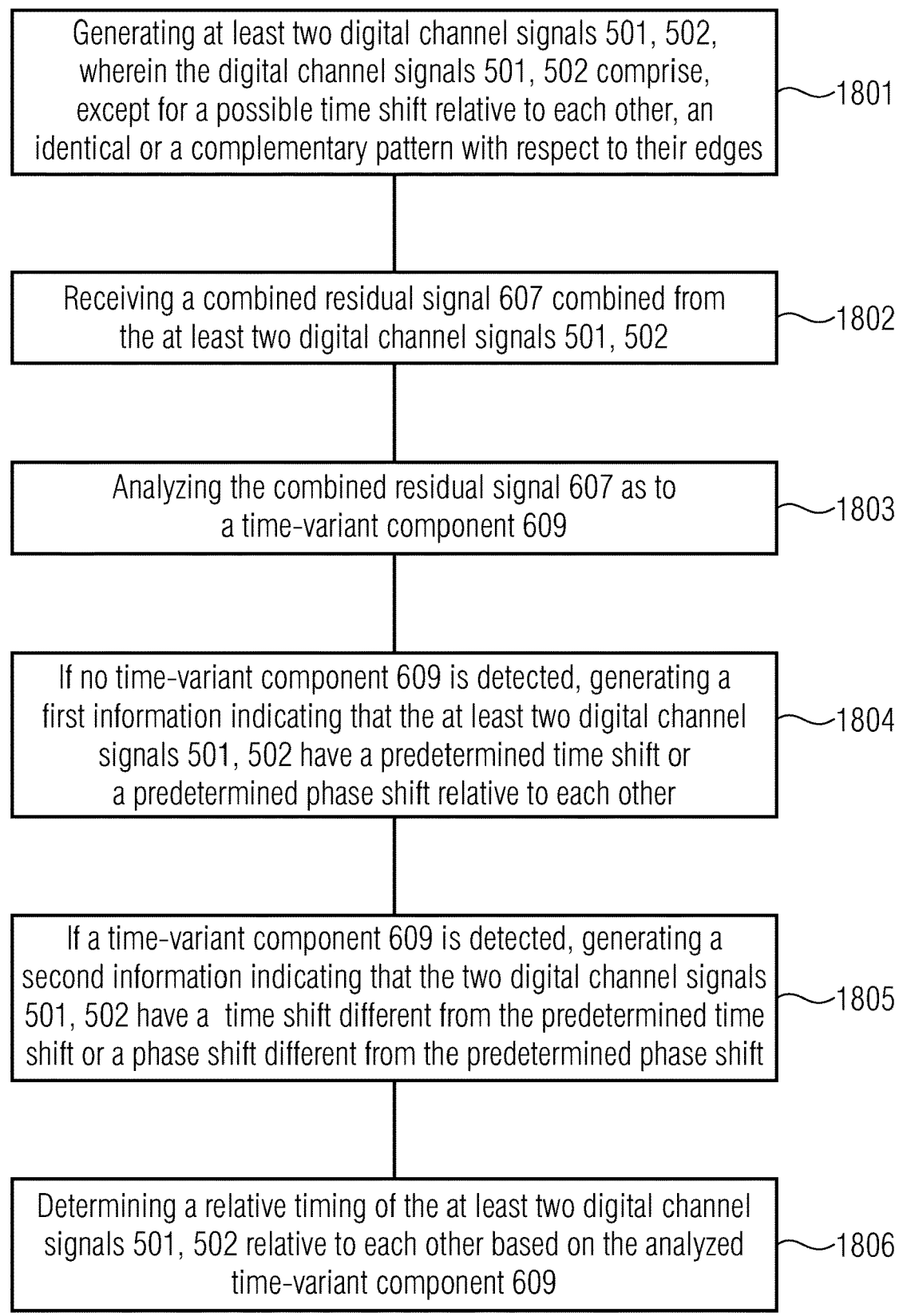
FIG. 18 shows a block diagram of an inventive method according to an aspect of the invention.

According to a fourth aspect of the invention, a method for calibrating an Automated Test Equipment 102 for automated testing of a Device Under Test is provided. The method is depicted in a block diagram in FIG. 18.

At block 1801, at least two digital channel signals 501, 502 are generated, wherein the digital channel signals 501, 502 comprise, except for a possible time shift relative to each other, an identical or a complementary pattern with respect to their edges.

At block 1802, a combined residual signal 607 that has been combined from the at least two digital channel signals 501, 502 is received. As described above, the combination of the at least two digital channel signals 501, 502 to the combined residual signal 607 can be done by either sum-combining or difference-combining the at least two digital channel signals 501, 502.

At block 1803, the combined residual signal 607 is analyzed as to a time-variant component 609. In other words, the combined residual signal 607 is measured and it is analyzed whether or not the combined residual signal 607 comprises a time-variant (AC) component 609. Furthermore, the magnitude and maybe phase of the time-variant (AC) component 609, if any, may be determined.

At block 1804 the method is described for the case that no time-variant component 609 is detected. If so, a first information is generated which indicates that the at least two digital channel signals 501, 502 have a predetermined time shift or a predetermined phase shift relative to each other. This first information may be a certain signal, e.g. a computer readable information, such as a flag, or the like.

At block 1805 the method is described for the case that a time-variant component 609 is detected. If so, a second information is generated which indicates that the two digital channel signals 501, 502 have a time shift different from the predetermined time shift or a phase shift different from the predetermined phase shift. This second information may be a certain signal, e.g. a computer readable information, such as a flag, or the like.

At block 1806 a relative timing of the at least two digital channel signals 501, 502 relative to each other is determined based on the analyzed time-variant component 609. In other words, for example the magnitude and phase of the analyzed (i.e. measured or determined) time-variant (AC) component 609 may be used for determining the magnitude of the relative time shift or phase shift of the at least two digital channel signals 501, 502 relative to each other. Accordingly, the channels 601, 602 via which the at least two digital channel signals 501, 502 are transmitted may be calibrated such that the at least two digital channel signals 501, 502 are generated with a predetermined time shift or phase shift relative to each other. The calibrated digital channel signals 501, 502 may then arrive without a time shift or a phase shift relative to each other at the point of combination 605. Additionally or alternatively to measuring amplitude and phase, it may be possible to measure only amplitude repeatedly and finding the minimum while varying the respective timing of the signals, just as described further above.

According to a fifth aspect, a computer program is provided. The computer program is for implementing the method that has been previously described with respect to FIG. 18, when being executed on a computer or signal processor.

Summarizing, an idea of the invention is to detect when at least two digital channel signals 501, 502, for example two repetitive clock signals, with substantially the same amplitude have an opposite phase, i.e. shifted relative to each other by 180°, at a connection point 605. For example, when the signals 501, 502 have perfect opposite phase, i.e. shifted relative to each other by substantially 180°, there is no AC (alternating current) signal 609 visible at that connection point 605, independent of what else is connected to that point 605, whereas a slight mismatch of the perfect opposite phase, i.e. a relative phase shift of more or less than 180°, manifests itself in a small AC signal 609, whose magnitude depends on what else is connected there.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

The apparatus described herein may be implemented using a hardware apparatus, or using a computer, or using a combination of a hardware apparatus and a computer.

The methods described herein may be performed using a hardware apparatus, or using a computer, or using a combination of a hardware apparatus and a computer.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A method for calibrating an Automated Test Equipment for automated testing of a Device Under Test, the method comprising:
   providing at least two digital channel signals by at least two different channels of the Automated Test Equipment, wherein the digital channel signals comprise, except for a possible time shift relative to each other, an identical or a complementary pattern with respect to their edges;
   sum-combining or difference-combining the at least two digital channel signals in order to acquire a combined residual signal;
   wherein combining is performed such that
   the combining provides a combined residual signal without a time-variant component if the at least two digital channel signals comprise a predetermined time shift or a predetermined phase shift relative to each other, or such that the combined residual signal comprises a time variant component if the two digital channel signals comprise a time shift different from the predetermined time shift or a phase shift different from the predetermined phase shift; and
   wherein the method further comprises measuring the combined residual signal and determining a relative timing of the at least two digital channel signals relative to each other on the basis of the measurement of the combined residual signal.

2. The method according to claim 1, wherein the measurement of the combined residual signal comprises performing a repeated measurement of the combined residual signal with varying timing-changes of at least one of the at least two different channels, and determining a minimum or a maximum of the time-variant components of the measured combined residual signals from the repeated measurement.

3. The method according to claim 1, wherein the measurement of the combined residual signal comprises performing at least one measurement and determining the magnitude and optionally the sign of the combined residual signal of said at least one measurement.

4. The method of claim 1, wherein at least two digital channel signals which comprise, except for a possible time shift relative to each other, a complementary pattern with respect to their edges are sum-combined, or wherein at least two digital channel signals which comprise, except for a possible time shift relative to each other, an identical pattern with respect to their edges are difference-combined.

5. The method of claim 1, wherein combining is performed such that the combining provides a combined residual signal without a time-variant component
   if the at least two digital channel signals comprise a time shift relative to each other that is zero or an integer multiple of the signal period duration, or
   if the at least two digital channel signals comprise a phase shift relative to each other that is zero degrees or 180 degrees.

6. The method of claim 1, wherein combining is performed such that the combining provides a combined residual signal without a time-variant component if a leading edge of one of the at least two digital channel signals appears at the same time as a leading edge of the other one of the at least two digital channel signals.

7. The method of claim 1, wherein the at least two digital channel signals are repetitive clock signals comprising an identical duty cycle or a complementary duty cycle.

8. The method of claim 1, wherein the at least two different channels of the Automated Test Equipment are programmed such that the at least two digital channel signals are generated with a desired predetermined phase shift of 0° or 180° relative to each other, and wherein, if the measured combined residual signal comprises a time variant component that is larger than a threshold value, the method further comprises calibrating the at least two different channels of the Automated Test Equipment by varying the timing of the at least two different channels relative to each other.

9. The method of claim 1, wherein the at least two different channels of the Automated Test Equipment are programmed such that the at least two digital channel signals are generated with a desired predetermined time shift being zero or an integer multiple of the signal period duration, and wherein, if the measured combined residual signal comprises a time variant component that is larger than a threshold value, the method further comprises calibrating the at least two different channels of the Automated Test Equipment by varying the timing of the at least two different channels relative to each other.

10. The method of claim 1, wherein measuring the combined residual signal comprises measuring the combined residual signal in the frequency domain.

11. The method of claim 1, wherein measuring the combined residual signal comprises determining the power of the combined residual signal and/or the root mean square value of the combined residual signal and/or the peak value of the combined residual signal and/or the peak-to-peak value of the combined residual signal.

12. A timing calibration unit for an Automated Test Equipment, the timing calibration unit comprising:
   a digital channel interface configured to receive at least two digital channel signals provided by at least two different channels of the Automated Test Equipment, wherein the digital channel signals comprise, except for a possible time shift relative to each other, an identical or a complementary pattern with respect to their edges;
   a combiner configured to sum-combine or difference-combine the at least two digital channel signals in order to acquire a combined residual signal;
   wherein the combiner is configured to perform the combining such that the combination provides a combined residual signal without a time-variant component if the at least two digital channel signals comprise a predetermined time shift or a predetermined phase shift relative to each other, and
   such that the combined residual signal comprises a time variant component if the two digital channel signals comprise a time shift different from the predetermined time shift or a phase shift different from the predetermined phase shift; and
   wherein the timing calibration unit is configured to measure the combined residual signal and to determine a relative timing of the at least two digital channel signals relative to each other on the basis of the measurement of the combined residual signal.

13. The timing calibration unit of claim 12, wherein, if the measured combined residual signal has a time-variant component, the timing calibration unit is configured to calculate from the time-variant component an amount of phase shift or time shift of the at least two digital channel signals relative to each other in order to determine the relative timing of the at least two digital channel signals relative to each other.

14. The timing calibration unit of claim 13, wherein the timing calibration unit is further configured to adjust the relative timing of the at least two digital channel signals relative to each other such that the measured combined residual signal does not comprise a time-variant component or such that the time-variant component is brought below a threshold value, wherein the adjustment depends on the calculated amount of phase shift or time shift of the at least two digital channel signals relative to each other.

15. The timing calibration unit of claim 12 wherein the combiner is configured to sum-combine at least two digital channel signals comprising, except for a possible time shift relative to each other, a complementary pattern with respect to their edges, or to difference-combine at least two digital channel signals comprising, except for a possible time shift relative to each other, an identical pattern with respect to their edges.

16. The timing calibration unit of claim 12, wherein the combiner comprises an operational amplifier that is circuited as a summing amplifier or as a differential amplifier.

17. The timing calibration unit of claim 16, wherein a low-pass filter or a bandpass filter is connected to an input and/or an output of the operational amplifier.

18. The timing calibration unit of claim 17, wherein the combination of the at least two digital channel signals is performed at an input of the low-pass filter or of the bandpass filter, and wherein an output of the low-pass filter or of the bandpass filter is coupled to an input of the operational amplifier.

19. A calibratable Automated Test Equipment comprising a digital channel signal generator configured to generate and to provide at least two digital channel signals by at least two different channels;
   wherein the digital channel signals comprise, except for a possible time shift relative to each other, an identical or a complementary pattern with respect to their edges; and
   a timing calibration unit including:
   a digital channel interface configured to receive at least two digital channel signals provided by at least two different channels of the Automated Test Equipment, wherein the digital channel signals comprise, except for a possible time shift relative to each other, an identical or a complementary pattern with respect to their edges;
   a combiner configured to sum-combine or difference-combine the at least two digital channel signals in order to acquire a combined residual signal;
   wherein the combiner is configured to perform the combining such that the combination provides a combined residual signal without a time-variant component if the at least two digital channel signals comprise a predetermined time shift or a predetermined phase shift relative to each other, and
   such that the combined residual signal comprises a time variant component if the two digital channel signals comprise a time shift different from the predetermined time shift or a phase shift different from the predetermined phase shift; and
   wherein the timing calibration unit is configured to measure the combined residual signal and to determine a relative timing of the at least two digital channel signals relative to each other on the basis of the measurement of the combined residual signal.

20. A method for calibrating an Automated Test Equipment for automated testing of a Device Under Test, the method comprising:
   generating at least two digital channel signals, wherein the digital channel signals comprise, except for a possible time shift relative to each other, an identical or a complementary pattern with respect to their edges;
   receiving a combined residual signal combined from the at least two digital channel signals;
   analyzing the combined residual signal as to a time-variant component and,
   if no time-variant component is detected, generating a first information indicating that the at least two digital channel signals comprise a predetermined time shift or a predetermined phase shift relative to each other, or
   if a time-variant component is detected, generating a second information indicating that the two digital channel signals comprise a time shift different from the predetermined time shift or a phase shift different from the predetermined phase shift; and determining a relative timing of the at least two digital channel signals relative to each other based on the analyzed time-variant component.

21. A non-transitory digital storage medium having a computer program stored thereon to perform the method for calibrating an Automated Test Equipment for automated testing of a Device Under Test, the method comprising:
   generating at least two digital channel signals, wherein the digital channel signals comprise, except for a possible time shift relative to each other, an identical or a complementary pattern with respect to their edges;
   receiving a combined residual signal combined from the at least two digital channel signals;

analyzing the combined residual signal as to a time-variant component and, if no time-variant component is detected, generating a first information indicating that the at least two digital channel signals comprise a predetermined time shift or a predetermined phase shift relative to each other, or if a time-variant component is detected, generating a second information indicating that the two digital channel signals comprise a time shift different from the predetermined time shift or a phase shift different from the predetermined phase shift; and determining a relative timing of the at least two digital channel signals relative to each other based on the analyzed time-variant component, when said computer program is run by a computer.

* * * * *